United States Patent
Kawada et al.

(10) Patent No.: US 8,648,353 B2
(45) Date of Patent: Feb. 11, 2014

(54) METHOD FOR MANUFACTURING SILICON CARBIDE SEMICONDUCTOR DEVICE AND THE SILICON CARBIDE SEMICONDUCTOR DEVICE

(75) Inventors: Yasuyuki Kawada, Matsumoto (JP); Takeshi Tawara, Matsumoto (JP)

(73) Assignee: Fuji Electric Co., Ltd. (JP)

( * ) Notice: Subject to any disclaimer, the term of this patent is extended or adjusted under 35 U.S.C. 154(b) by 0 days.

(21) Appl. No.: 13/532,042

(22) Filed: Jun. 25, 2012

(65) Prior Publication Data
US 2012/0261677 A1 Oct. 18, 2012

Related U.S. Application Data

(62) Division of application No. 12/628,819, filed on Dec. 1, 2009, now Pat. No. 8,232,184.

(30) Foreign Application Priority Data

Dec. 1, 2008 (JP) .................................. 2008-306870
Mar. 31, 2009 (JP) .................................. 2009-087895

(51) Int. Cl.
*H01L 21/02* (2006.01)

(52) U.S. Cl.
USPC  257/77; 257/72; 257/E21.215; 257/E29.068; 257/E29.104; 257/E29.262

(58) Field of Classification Search
USPC ......... 257/72–77, 334, 415, E21.215, 29.068, 257/104, 198, 262
See application file for complete search history.

(56) References Cited

U.S. PATENT DOCUMENTS

| 6,727,544 B2 | 4/2004 | Endoh et al. |
| 7,061,038 B2 | 6/2006 | Endoh et al. |
| 7,154,569 B2 | 12/2006 | Lee et al. |
| 7,951,636 B2 | 5/2011 | Lee et al. |
| 7,973,309 B2 | 7/2011 | Kim et al. |
| 7,977,679 B2 | 7/2011 | Cho |

(Continued)

FOREIGN PATENT DOCUMENTS

| JP | 2001-168329 A | 6/2001 |
| JP | 2001-332727 A | 11/2001 |

(Continued)

OTHER PUBLICATIONS

Notification of Reasons for Refusal for corresponding JP 2009-087895, dated Aug. 13, 2013. Partial English translation provided.

*Primary Examiner* — Michael Lebentritt
(74) *Attorney, Agent, or Firm* — Rossi, Kimms & McDowell LLP

(57) ABSTRACT

Silicon carbide semiconductor device includes trench, in which connecting trench section is connected to straight trench section. Straight trench section includes first straight trench and second straight trench extending in parallel to each other. Connecting trench section includes first connecting trench perpendicular to straight trench section, second connecting trench that connects first straight trench and first connecting trench to each other, and third connecting trench that connects second straight trench and first connecting trench to each other. Second connecting trench extends at 30 degrees of angle with the extension of first straight trench. Third connecting trench extends at 30 degrees of angle with the extension of second straight trench. A manufacturing method according to the invention for manufacturing a silicon carbide semiconductor device facilitates preventing defects from being causes in a silicon carbide semiconductor device during the manufacture thereof.

5 Claims, 23 Drawing Sheets

(56) References Cited

U.S. PATENT DOCUMENTS

| | | |
|---|---|---|
| 8,232,184 B2 * | 7/2012 | Kawada et al. ............... 438/460 |
| 2002/0154556 A1 | 10/2002 | Endoh et al. |
| 2004/0183128 A1 | 9/2004 | Muraoka et al. |
| 2005/0101087 A1 | 5/2005 | Endoh et al. |
| 2006/0164565 A1 | 7/2006 | Lee et al. |
| 2008/0169473 A1 | 7/2008 | Cho |
| 2009/0283764 A1 | 11/2009 | Kim et al. |
| 2010/0072561 A1 | 3/2010 | Lee et al. |
| 2010/0320612 A1 | 12/2010 | Uchida et al. |

FOREIGN PATENT DOCUMENTS

| | | |
|---|---|---|
| JP | 2003-188379 A | 7/2003 |
| JP | 2004-200540 A | 7/2004 |
| JP | 2005-340685 A | 12/2005 |
| JP | 2006-032420 A | 2/2006 |
| JP | 2008-177538 A | 7/2008 |
| WO | 2006/035877 A1 | 4/2006 |

\* cited by examiner

FIG. 82

|  | Circular pattern diameters | Trench shapes after etching | Trench shapes after heat treatment |
|---|---|---|---|
| 1st. Specimen | 1.7 μm | Hexagonal | Hexagonal |
| 2nd. Specimen | 2.5 μm | Hexagonal | Hexagonal |
| 3rd. Specimen | 4 μm | Hexagonal | Dodecagonal |
| 4th. Specimen | 5.6 μm | Dodecagonal | Dodecagonal |
| 5th. Specimen | 8 μm | Dodecagonal | Octadecagonal |
| 6th. Specimen | 12 μm | Octadecagonal | Octadecagonal |
| 7th. Specimen | 26 μm | Triacontadigonal | Triacontadigonal |
| 8th. Specimen | 48 μm | Almost circular | Almost circular |

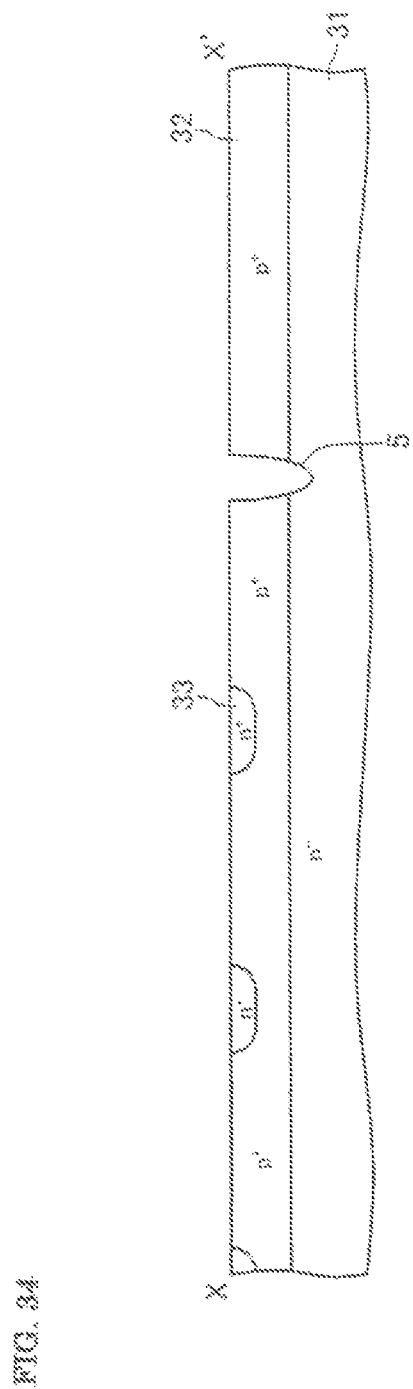

METHOD FOR MANUFACTURING SILICON CARBIDE SEMICONDUCTOR DEVICE AND THE SILICON CARBIDE SEMICONDUCTOR DEVICE

This is a divisional of 12/628,819, filed Dec. 1, 2009, for which benefit is claimed, and status is pending, which in turn claims priority from JP Application No. 2008-306870, filed Dec. 1, 2008, and JP Application No. 2009-087895, filed Mar. 31, 2009, the contents of which are incorporated herein by reference.

BACKGROUND OF THE INVENTION

A. Field of the Invention

The present invention relates to a method for manufacturing a silicon carbide semiconductor device and the silicon carbide semiconductor device. Specifically, the invention relates to a method for manufacturing a silicon carbide semiconductor device having a trench structure and the silicon carbide semiconductor device having a trench structure.

B. Description of the Related Art

In the semiconductor devices such as a metal oxide semiconductor field effect transistor (hereinafter referred to as a "MOSFET") and an insulated gate bipolar transistor (hereinafter referred to as an "IGBT") having a trench structure, straight trenches, for example, are formed in a stripe pattern from the surface of a semiconductor substrate.

In the semiconductor devices having a straight trench structure, electric field localization occurs at the end portion of the trench, when a high voltage is applied to the semiconductor devices. When a pointing trench end portion is caused by dry etching, electric field localization is liable to be caused at the pointing trench end portion. As the electric field localizes to the trench end portion and exceeds the breakdown voltage of the semiconductor device to the higher side, there is a high probability that the semiconductor device will break down.

FIG. 43 is an electron micrograph that shows the result of a leakage analysis conducted on a MOSFET having a conventional trench structure. The MOSFET is observed by emission microscopy (hereinafter referred to as "EMS"). In the MOSFET shown in FIG. 43, straight trench 101 is disposed in a silicon carbide semiconductor device (hereinafter referred to sometimes as an "SiC semiconductor device") that employs a silicon carbide semiconductor substrate (hereinafter referred to as an "SiC substrate"). In end portion 102 (indicated by a double-dotted-chain circle) of trench 101, a light emission caused by current leakage is observed. In the portion that emits light as shown in FIG. 43, electric field localization is liable to result and, therefore, the portion that emits light as shown in FIG. 43 will break down with a high probability.

To avoid the problem described above, the trench end portion is rounded or the trench end portions are connected to each other to remove trench end portions in the silicon semiconductor device (hereinafter referred to as the "Si device") that employs a silicon (Si) semiconductor substrate.

A semiconductor device as described below that has a trench structure, in which the trench end corner section is rounded, is proposed in the following Patent Document 1. In the semiconductor device proposed in Japanese Unexamined Patent Application Publication No. 2003-188379, the width of the trench in the vicinity of the end portion thereof is set to be narrower in the planar shape than the width of the trench in the trunk portion thereof. The trench is formed by dry-etching such that the depth of the trench in the vicinity of the end portion thereof is set to be shallower than the depth of the trench in the trunk portion thereof and the trench end corner section is rounded. By the structure described above, a singular point is prevented from causing on the gate oxide film or the gate electrode in the trench end corner section to relax the electric field localization to the trench end corner section or to prevent the breakdown voltage in the trench end corner section from decreasing.

The semiconductor device proposed in Japanese Patent Publication No. 4130356 includes a semiconductor layer on a semiconductor substrate; a first cell region and a second cell region in the semiconductor layer, the first cell region and the second cell region being adjacent to each other; each of the first and second cell regions including a plurality of stripe-shaped trench lines extending in perpendicular to the boundary between the first and second cell regions; each of the trench lines having a first end portion and a second end portion; first connection trenches connecting the first end portions of some pairs of the adjacent trench lines such that the first end portions of at least a pair of the adjacent trench lines are not connected to each other; second connection trenches connecting the second end portions of some pairs of the adjacent trench lines such that all the trench lines in each of the first and second cell regions are connected to each other but such that the second end portions of at least another pair of the adjacent trench lines are not connected to each other; gate insulator films in the trench lines, the first connection trenches and the second connection trenches; gate electrodes buried in the trench lines, the first connection trenches and the second connection trenches with the respective gate insulator films interposed therebetween; a gate wiring on the semiconductor layer, the gate wiring being on the boundary between the first and second cell regions, the gate wiring being connected electrically to the gate electrodes; a first electrode on the first major surface of the semiconductor layer; a second electrode on the second major surface of the semiconductor layer; and at least one of the first connection trenches in the second cell region not facing to any of the second connection trenches in the first cell region.

The semiconductor device proposed in Japanese Unexamined Patent Application Publication No. 2001-168329 has a trench structure in which adjacent trenches are connected with each other with a U-shaped connecting trench such that the end portion of a trench facing the chip edge and the end portion of the adjacent trench are connected with each other with the connecting trench having a large curvature and disposed in a p-type well region.

Another semiconductor device proposed in Japanese Unexamined Patent Application Publication No. 2001-332727 has a trench structure, in which adjacent trenches are connected with each other with a U-shaped connecting trench such that the end portion of a trench facing to the chip edge and the end portion of the adjacent trench are connected with each other by the connecting trench, the width thereof is larger than the width of the straight section of the trench.

As a result of investigation conducted by the present inventors, it has been found that the following problems will be caused, if the techniques described above are applied to the SiC semiconductor device. In the following, the problems caused are described, for example, in connection with the application of the technique proposed in Japanese Unexamined Patent Application Publication No. 2001-168329 to the SiC semiconductor device.

FIG. 36 is an electron micrograph of a conventional silicon carbide semiconductor device before the heat treatment thereof from the surface side thereof. The SiC semiconductor device is observed under a scanning electron microscope (hereinafter referred to as a "SEM"). (The SiC semiconductor devices are observed also under a SEM in FIGS. 1 through 31 and in FIG. 33.) Trench 111 is formed in the surface portion of the SiC semiconductor device. Trench 111 is formed of adjoining straight trenches (hereinafter referred to collectively as "straight trench section") 112 and semicircular connecting trench (hereinafter referred to as "connecting trench section") 113 that connects the end portions of the adjoining trenches constituting straight trench section 112 with each other with a semicircular curve.

In the SiC semiconductor device shown in FIG. 36, trench 111 is formed by dry-etching. In some portions 114 of connecting trench section 113, the trench width is narrowed or an uneven trench side wall occurs. (Hereinafter, these defects will be referred to as "defective trench formations 114 caused by trench etching" or simply as "defective trench formations 114.") It is estimated that defective trench formations 114 are caused by the variation of the dry-etching speed depending on the crystal plane of the SiC semiconductor device (the crystal plane dependence of the dry-etching speed).

FIG. 37 is an electron micrograph that shows the conventional silicon carbide semiconductor device after the heat treatment thereof from the surface side thereof.

The heat treatment is conducted in an argon (Ar) gas, to which monosilane ($SiH_4$) is added at the flow rate ratio of 0.4%, under the pressure of 80 Torr and at 1700° C. for 60 minutes. The SiC semiconductor device is observed using a focused ion beam (hereinafter referred to as an "FIB"). (The SiC semiconductor devices are observed using an FIB in also FIGS. 38 through 42.) In the conventional SiC semiconductor device shown in FIG. 36 and treated thermally, it is confirmed that defective portion 115 filled occurs in connecting trench section 113. (Hereinafter defective portion 115 will be referred to as "defective trench formation 115.")

The states of defective trench formation 115 are observed by cutting out the cross sections of the SiC semiconductor device. FIG. 38 is an electron micrograph observing the cross section along the line segment A-A' of FIG. 37. FIG. 39 is an electron micrograph observing the cross section along the line segment B-B' of FIG. 37. FIG. 40 is an electron micrograph observing the cross section along the line segment C-C' of FIG. 37. FIG. 41 is an electron micrograph observing the cross section along the line segment D-D' of FIG. 37. FIG. 42 is an electron micrograph observing the cross section along the line segment E-E' of FIG. 37.

A wolfram (W) protector film is deposited on the SiC semiconductor device for protecting the surface thereof in micro-machining a specific micro area with an FIB. FIGS. 38, 40 and 42 show the trench remaining in the SiC semiconductor device. In contrast, the trenches in the SiC semiconductor devices shown in FIGS. 39 and 41 are filled and almost not remaining in the SiC semiconductor devices.

In manufacturing a semiconductor device having a trench structure, a heat treatment is conducted, after forming trenches, at 1500° or higher to improve the shapes of the trenches and to activate the implanted impurity atoms. In the SiC semiconductor device, the heat treatment as described above narrows the trench in a part of the connecting trench section or deforms the trench to be shallow. It is found that the locations in the connecting trench section, at which the deformations such as a narrowed trench and a shallow trench are caused by the heat treatments, and the magnitudes of the deformations are different depending on the curvature of the connecting trench section.

The curvature of the connecting trench section is determined by the spacing (cell pitch) between the trenches in the straight trench section. In other words, it is found that different magnitudes of unevenness are caused at different locations on the side wall and the bottom plane of the connecting trench section depending on the cell pitch. If the portion of the connecting trench section narrowed by trench-etching (cf. FIG. 36) is further narrowed by a heat treatment, a part of the connecting trench section will be filled. If a part of the connecting trench section is deformed greatly by the unevenness caused by the heat treatment, the unevenness itself will cause defective trench formation.

If the straight trench section is connected with a connecting trench section, a part of the connecting trench section will be filled, as described above, by the heat treatment conducted at 1500° C. or higher on the SiC semiconductor device. If a part of the connecting trench section is filled, an end portion will be caused on the trench or the trench end portion will be pointed. If the electric field localizes to the trench end portion, the SiC semiconductor device will be deteriorated or broken down.

In view of the foregoing, it would be desirable to obviate the problems described above. It would be also desirable to provide a method for manufacturing a silicon carbide semiconductor device that facilitates preventing defects from causing during the manufacture thereof. It would be further desirable to provide a non-defective silicon carbide semiconductor device. The present invention is directed to overcoming or at least reducing the effects of one or more of the problems set forth above.

SUMMARY OF THE INVENTION

According to the subject matter of the appended claim 1, there is provided a method for manufacturing a silicon carbide semiconductor device, the method forming a trench from the surface of a substrate made of a silicon carbide semiconductor, the trench including a first straight trench section including first straight trenches extending in parallel to each other, the method including the step of:

connecting the end portions of the adjacent first straight trenches to each other with a second straight trench section extending at 30 degrees of angle with the first straight trench section and a third straight trench section extending in perpendicular to the first straight trench section such that a polygon is formed;

connecting the end portions of the adjacent first straight trenches to each other with a fourth straight trench section extending at 60 degrees of angle with the first straight trench section and the third straight trench section extending in perpendicular to the first straight trench section such that a polygon is formed; or connecting the end portions of the adjacent first straight trenches to each other with the second straight trench section, the fourth straight trench section and the third straight trench section such that a polygon is formed.

According to the subject matter of the appended claim 2, the spacing between the first straight trenches described in the appended claim 1 and connected to each other with the second straight trench section or the fourth straight trench section and the third straight trench section is from 1.7 μm to 2.5 μm.

According to the subject matter of the appended claim 3, the spacing between the first straight trenches described in the appended claim 1 and connected to each other with the second straight trench section, the fourth straight trench section, and the third straight trench section is from 4 μm to 5.6 μm.

According to the subject matter of the appended claim 4, there is provided a method for manufacturing a silicon carbide semiconductor device, the method forming a trench from the surface of a substrate made of a silicon carbide semiconductor, the trench including a first straight trench section including first straight trenches extending in parallel to each other, the method including the step of:

connecting the end portions of the adjacent first straight trenches to each other with a fifth straight trench section extending in perpendicular to the first straight trench section such that a polygon is formed by the inner side walls of the first straight trenches and the side wall of the fifth straight trench section continuous to the inner side walls of the first straight trenches.

According to the subject matter of the appended claim 5, the first straight trenches described in the appended claim 4 are widened gradually from the end portions thereof to the fifth straight trench section.

According to the invention, there is provided a method for manufacturing a silicon carbide semiconductor device, the method forming a trench from the surface of a substrate made of a silicon carbide semiconductor, the trench including a first straight trench section including first straight trenches extending in parallel to each other, the method including the step of:

connecting the end portions of the adjacent first straight trenches to each other with a sixth straight trench section extending at 20 degrees of angle with the first straight trench section, a seventh straight trench section extending at 40 degrees of angle with the first straight trench section, a fourth straight trench section extending at 60 degrees of angle with the first straight trench section, an eighth straight trench section extending at 80 degrees of angle with the first straight trench section, and a third straight trench section extending in perpendicular to the first straight trench section such that a polygon is formed.

According to the invention, the spacing between the first straight trenches in one embodiment is from 8 μm to 12 μm.

According to the invention, there is provided a method for manufacturing a silicon carbide semiconductor device, the method forming a trench from the surface of a substrate made of a silicon carbide semiconductor, the trench including a first straight trench section including first straight trenches extending in parallel to each other, the method including the step of:

connecting the end portions of the adjacent first straight trenches to each other with a ninth straight trench section extending at 11.25 degrees of angle with the first straight trench section, a tenth straight trench section extending at 22.5 degrees of angle with the first straight trench section, an eleventh straight trench section extending at 33.75 degrees of angle with the first straight trench section, a twelfth straight trench section extending at 45 degrees of angle with the first straight trench section, a thirteenth straight trench section extending at 56.25 degrees of angle with the first straight trench section, a fourteenth straight trench section extending at 67.5 degrees of angle with the first straight trench section, a fifteenth straight trench section extending at 78.75 degrees of angle with the first straight trench section, and a third straight trench section extending in perpendicular to the first straight trench section such that a polygon is formed.

According to the invention, the spacing between the first straight trenches in one embodiment is wider than 12 μm.

According to the invention, the side walls in the first straight trench section are made to coincide with the (1-100) plane and the (-1100) plane of hexagonal silicon carbide having a four-layered stacking structure (hereinafter referred to as "4H—SiC"). In writing the Miller indices, a bar "-" is prefixed to a numeral for indicating a negative index.

According to the invention, the trenches are formed by dry-etching.

According to the invention, the method further includes the step of thermally treating the trenches at 1500° C. or higher after forming the trenches.

According to the subject matter of the invention, there is provided a silicon carbide semiconductor device including:

a silicon carbide semiconductor substrate of a first conductivity type;

a trench in the surface portion of the semiconductor substrate, the end portions of the trenches being connected to each other such that a polygon is formed;

a base region of a second conductivity type disposed in adjacent to the trench;

a source region of the first conductivity type disposed in the base region; and a gate electrode in the trench with a gate insulator film interposed therebetween.

According to the invention, a trench is formed in a silicon carbide semiconductor device such that the trench includes a first straight trench section including first straight trenches, the end portions thereof are connected with each other with a third straight trench section extending in perpendicular to the first straight trench section and any one or both of a second straight trench section extending at 30 degrees of angle with the first straight trench section and a fourth straight trench section extending at 60 degrees of angle with the first straight trench section.

According to the invention, the trench sections connecting the end portions of the first straight trenches are connected to form a polygon, depending on the spacing between the first straight trenches (cell pitch), having side walls which are hardly deformed by a heat treatment (such as half the circumference of a hexagon, half the circumference of a dodecagon, half the circumference of an octadecagon and half the circumference of a triacontagon). Therefore, it is possible to manufacture a silicon carbide semiconductor device that facilitates preventing the trenches thereof from being filled by the heat treatment conducted at 1500° C. or higher. Since it is possible to manufacture a silicon carbide semiconductor device that includes no end portions left in the trench according to the invention, the electric field is prevented from localizing to the end portions of the trench. Therefore, it is possible to prevent the silicon carbide semiconductor device according to the invention from being deteriorated or broken down.

The manufacturing methods according to the invention facilitate preventing defects from causing in the silicon carbide semiconductor devices.

BRIEF DESCRIPTION OF THE DRAWINGS

The foregoing advantages and features of the invention will become apparent upon reference to the following detailed description and the accompanying drawings, of which:

FIG. 32 is a table describing the curvatures of circular trenches and the shapes of the trenches before and after the heat treatment thereof.

FIG. 34 is a cross sectional view along the line segment X-X' of FIG. 33.

FIG. 35 is a cross sectional view along the line segment Y-Y' of FIG. 33.

DETAILED DESCRIPTION OF SPECIFIC EMBODIMENTS

Figure 1:
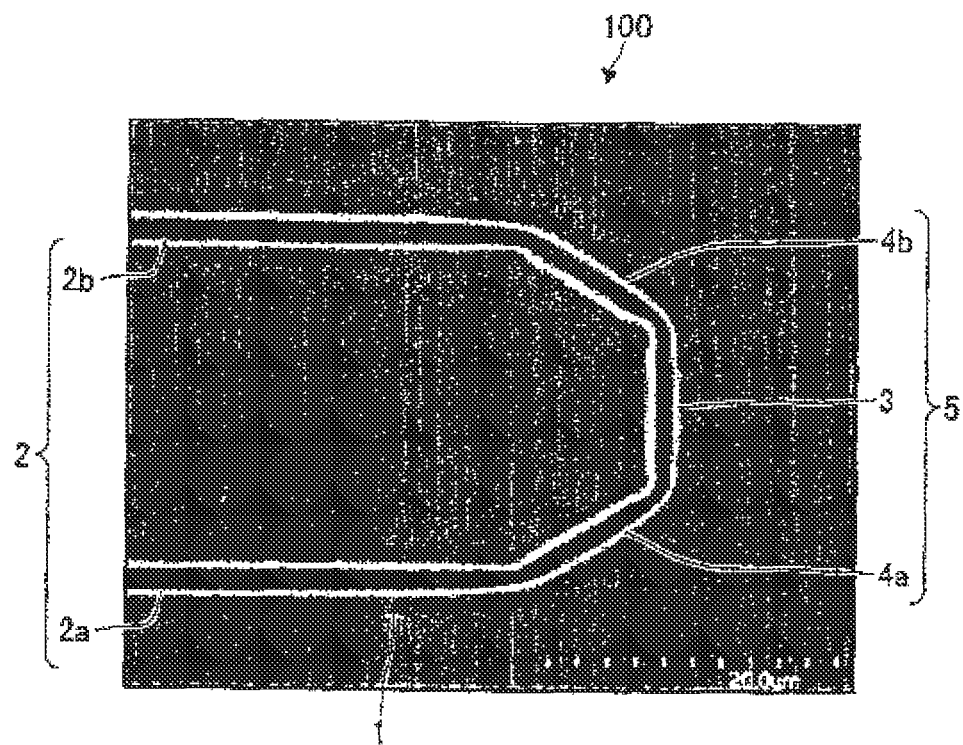
FIG. 1 is an electron micrograph that observes the surface of a silicon carbide semiconductor device according to a first embodiment of the invention.

Now the invention will be described in detail hereinafter with reference to the accompanied drawings which illustrate the preferred embodiments of the invention.

Throughout the following descriptions and the accompanied drawings, the same reference numerals are used for designating the same constituent elements and their duplicated descriptions are omitted for the sake of simplicity.

In the following descriptions, silicon carbide will be hexagonal silicon carbide having a four-layered stacking structure (hereinafter referred to as "4H—SiC"), if not specifically described otherwise.

First Embodiment

FIG. 1 is an electron micrograph that observes the surface of a silicon carbide semiconductor device according to a first embodiment of the invention.

Silicon carbide semiconductor device (hereinafter referred to as "SiC semiconductor device") 100 includes, for example, an SiC single crystal substrate or a substrate including an SiC single crystal substrate and an SiC epitaxial layer on the SiC single crystal substrate (hereinafter referred to collectively as an "SiC substrate") and trench 1 formed in the surface portion of the SiC substrate. Trench 1 is formed of adjoining straight trenches (hereinafter referred to as "straight trench section") 2 and connecting trench section 5 connecting the end portions of straight trench section 2. In the SiC substrate, a plurality of trenches 1 is disposed almost in parallel to straight trench section 2, for example, in a stripe pattern. Straight trench section 2 corresponds to a first trench section.

Straight trench section 2 is disposed, for example, in the channel region of SiC semiconductor device 100. First trench (hereinafter referred to as "first straight trench") 2a that constitutes straight trench section 2 and second trench (hereinafter referred to as "second straight trench") 2b that also constitutes straight trench section 2 are arranged almost in parallel to each other. The side walls of first straight trench 2a are made to coincide, for example, with the (1-100) plane and the (-1100) plane of 4H—SiC. The side walls of second straight trench 2b are made to coincide also with the (1-100) plane and the (-1100) plane of 4H—SiC.

Connecting trench section 5 is disposed, for example, in a region outside the channel region (hereinafter referred to as an "edge region") of SiC semiconductor device 100. Connecting trench section 5 includes straight trench 3 extending perpendicular to straight trench section 2 (hereinafter referred to as "first connecting trench 3"), straight trench 4a that connects the end portion of first straight trench 2a and the first end portion of first connecting trench 3 (hereinafter referred to as "second connecting trench 4a"), and straight trench 4b that connects the end portion of second straight trench 2b and the second end portion of first connecting trench 3 (hereinafter referred to as "third connecting trench 4b"). By the formation of these connecting trenches, connecting trench section 5 is shaped to be polygonal. First connecting trench 3 corresponds to a third trench section. Second and third connecting trenches 4a and 4b correspond to a second trench section.

Second connecting trench 4a is disposed such that the angle between second connecting trench 4a and the extension of first straight trench 2a (hereinafter referred to as the "first connection angle") will be 30 degrees of angle, if measured from the extension of first straight trench 2a toward the inside of straight trench section 2. Third connecting trench 4b is disposed such that the angle between third connecting trench 4b and the extension of second straight trench 2b (hereinafter referred to as the "second connection angle") will be 30 degrees of angle, if measured from the extension of second straight trench 2b toward the inside of straight trench section 2.

By setting the first and second connection angles to be 30 degrees of angle, it is possible to prevent a part of connecting trench section 5 from being filled to vanish or from being made to be shallow, for example, by a heat treatment conducted at 1500° C. or higher. The reason for this will be described later.

Figure 2:
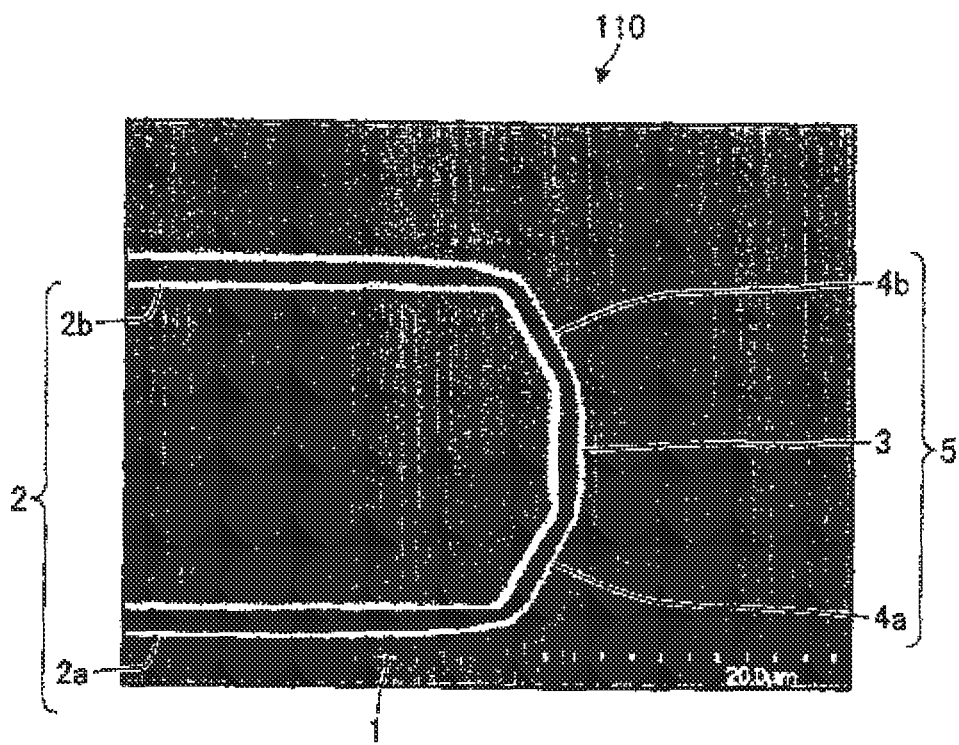
FIG. 2 is another electron micrograph that observes the surface of another silicon carbide semiconductor device according to the first embodiment of the invention.

FIG. 2 is another electron micrograph that observes the surface of another SiC semiconductor device according to the first embodiment of the invention.

As shown in FIG. 2, trenches are formed in SiC semiconductor device 110 so that the first and second connection angles may be 60 degrees of angle. The reason for this will be described later. In the structure shown in FIG. 2, second and third connecting trenches 4a and 4b correspond to a fourth trench section. The other structure in SiC semiconductor device 110 is the same as that of SiC semiconductor device 100 shown in FIG. 1.

Now the method for manufacturing the SiC semiconductor devices described above will be described below.

For example, an off-substrate tilted by 8 degrees of angle from the (0001) C plane of 4H—SiC or an off-substrate tilted by 8 degrees of angle from the (0001) C plane of 4H—SiC, on which an SiC epitaxial layer is laminated, is used for the SiC substrate. At first, the SiC substrate is washed to remove the particles and organic materials on the surface of the SiC substrate. Then, a silicon dioxide ($SiO_2$) film is formed on the (0001) C plane of the SiC substrate by plasma-enhanced chemical vapor deposition (hereinafter referred to as "PECVD" or simply as "plasma CVD"). To form the $SiO_2$ film, monosilane (SiH4), oxygen (O2), and argon are used as the raw material gases. Very high frequency (VHF) electric power, for example, is fed to the CVD apparatus for the electric power for plasma generation.

Then, the SiC substrate is washed and a photoresist is coated on the $SiO_2$ film using a coating apparatus and such an apparatus. Then, the pattern of the reticle, in which the trench pattern is formed, is copied to the photoresist using a stepper. In the trench pattern, trenches, including straight trenches, the end portions of which are connected to each other via a connecting trench section and constituting a straight trench section, are arranged in a stripe pattern. Development is conducted to form the trench pattern in the photoresist. The trench pattern is examined and confirmed under a microscope and then the first bake is conducted on the photoresist. The second bake is conducted on the photoresist in an oven to bake the photoresist hard.

Then, the $SiO_2$ film is dry-etched in a reactive ion etching (hereinafter referred to as an "RIE") apparatus using the photoresist for a mask. For example, a mixed gas containing trifluoromethane ($CHF_3$) and argon is used for a reaction gas for dry-etching the $SiO_2$ film. Radio frequency (RF) electric power is fed to the RIE apparatus.

The photoresist on the SiC substrate is burned to ashes with the plasma of a reactive gas to decompose and remove the photoresist on the SiC substrate. For example, a mixed gas containing trifluoromethane and oxygen is used for a reaction gas. RF electric power is fed to the ashing apparatus. After the ashing, the SiC substrate is immersed in a liquid for peeling off the photoresist to completely remove the photoresist remaining on the SiC substrate. Then the SiC substrate is immersed and washed in isopropyl alcohol (IPA). The SiC substrate is washed with pure water and dried.

Trenches are formed by dry-etching in the surface portion of the SiC substrate using the SiO2 film for a mask. An etching apparatus which use an inductively coupled plasma (hereinafter referred to as an "ICP") is used for the dry-etching. Sulfur hexafluoride, oxygen, and argon are used for the reaction gases. ICP electric power for plasma generation and electric power for a bias power supply are fed to the etching apparatus.

The SiC substrate is immersed in hydrofluoric acid (HF) for 30 minutes or longer to remove all the $SiO_2$ film. Then, the SiC substrate is treated thermally at 1500° C. or higher. The thermal treatment is conducted, for example, in an argon gas, to which monosilane is added at the flow rate ratio of 0.4%, under the pressure of 80 Torr and at 1700° C. for 60 minutes. A source region and a drain region are formed on the SiC substrate by ion implantation to form, for example, a MOSFET structure on the SiC substrate. Thus, an SiC semiconductor device is completed.

The second bake facilitates improving the resistance of the photoresist against reactive ion etching, for example. By thermally treating the SiC substrate after forming the trenches, the micro defects caused in the trenches and the unevenness caused on the trench side walls are removed and the trenches are brought into a good shape.

The SiC semiconductor devices shown in FIGS. 1 and 2 are manufactured by the method described above. An off-substrate tilted by 8 degrees of angle from the (0001) C plane of 4H—SiC is employed. The $SiO_2$ film is formed by plasma CVD. The $SiO_2$ film is set to be 2.5 μm thick. In forming the $SiO_2$ film, the pressure inside the CVD chamber is set at 50 Pa. Monosilane, oxygen and argon are fed to the CVD chamber for the raw material gases. VHF electric power of 60 MHz and 500 W is fed for the electric power for plasma generation. The substrate temperature during the film formation is set at 400° C. For the light exposure, a reticle, in which a trench pattern, 1.5 µm wide, is formed, is employed. The first bake is conducted at 100° C. for 1 minute. The second bake is conducted at 120° C. for 15 minutes. The photoresist is about 2.5 µm thick after the second bake.

An RIE apparatus is used for patterning the $SiO_2$ film. The pressure inside the etching chamber is set at 3 Pa. A mixed gas containing trifluoromethane and argon is introduced for the reaction gas into the etching chamber at the respective flow rates of 10 sccm and 10 sccm. RF electric power of 75 W is fed to the etching chamber. The ashing is conducted in an ashing chamber, the inside pressure of which is set at 150 Pa. A mixed gas containing trifluoromethane and argon is introduced into the ashing chamber at the respective flow rates of 4 sccm and 100 sccm. RF electric power of 150 W is fed to the ashing chamber.

The trench etching on the SiC substrate is conducted in an ICP etching apparatus. The pressure inside the etching chamber is set at 2 Pa. Sulfur hexafluoride, oxygen and argon are fed as the reaction gases to the etching chamber at the respective flow rates of 8.5 sccm, 1.5 sccm and 50 sccm. ICP electric power of 450 W is fed for the electric power for plasma generation and electric power of 8 W is fed as the bias power supply. Trenches are set to be from 3.5 to 4.5 µm deep. Since side etching occurs, the resulting trench width is 2 µm. The orientation flat of the SiC substrate is set on the (1-100) plane or the (-1100) plane. Trenches are formed such that the straight trench sections are parallel to the orientation flat. The trench side walls are made to coincide with the (1-100) plane and the (-1100) plane of 4H—SiC. After the trenches are formed, a heat treatment is conducted in an argon gas, to which monosilane is added at the flow rate ratio of 0.4%, under the pressure of 80 Torr and at 1700° C. for 60 minutes.

Figure 3:
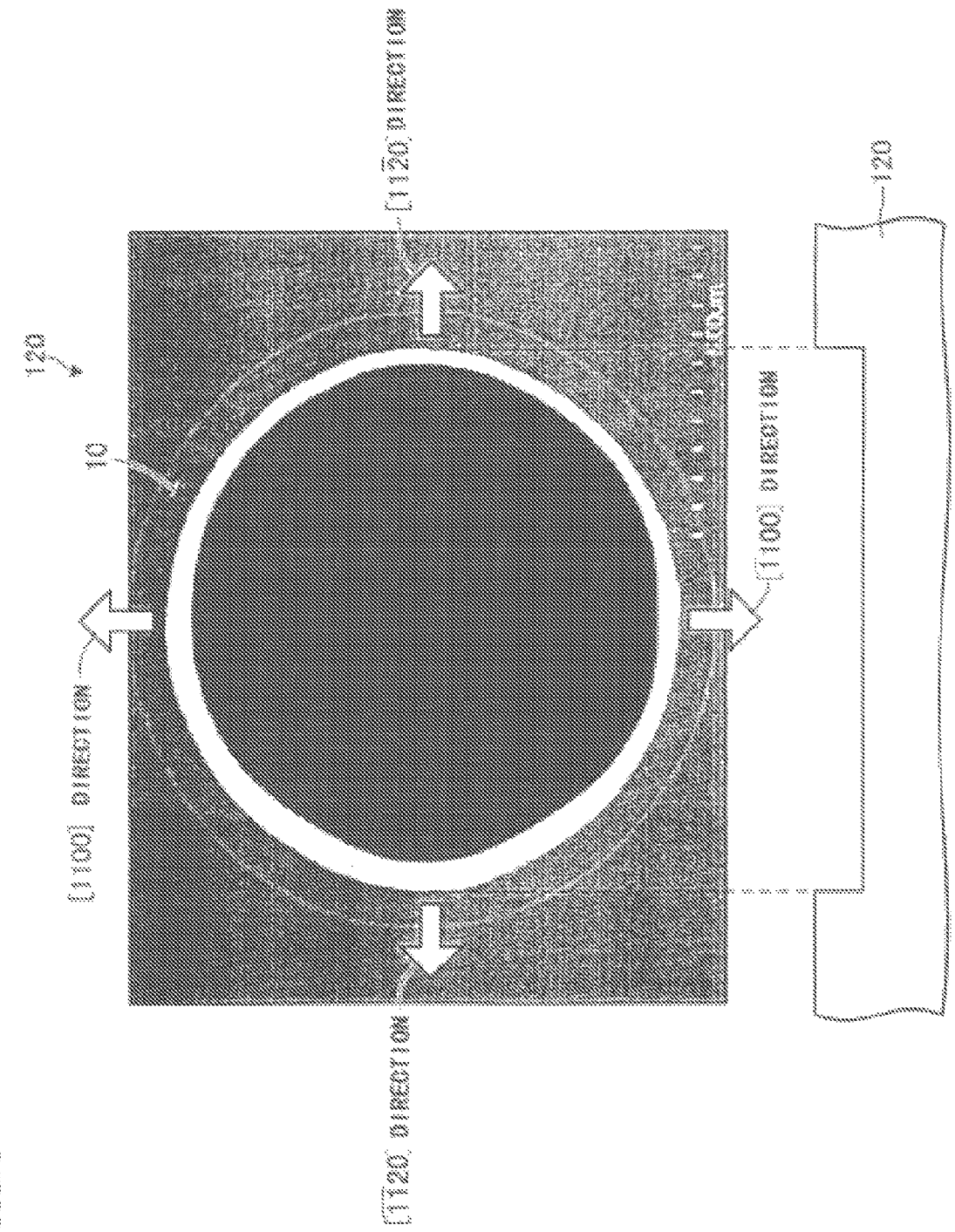
FIG. 3 is an electron micrograph observing the surface, in which a circular trench is disposed, of a silicon carbide semiconductor device before the heat treatment thereof.
Figure 4:
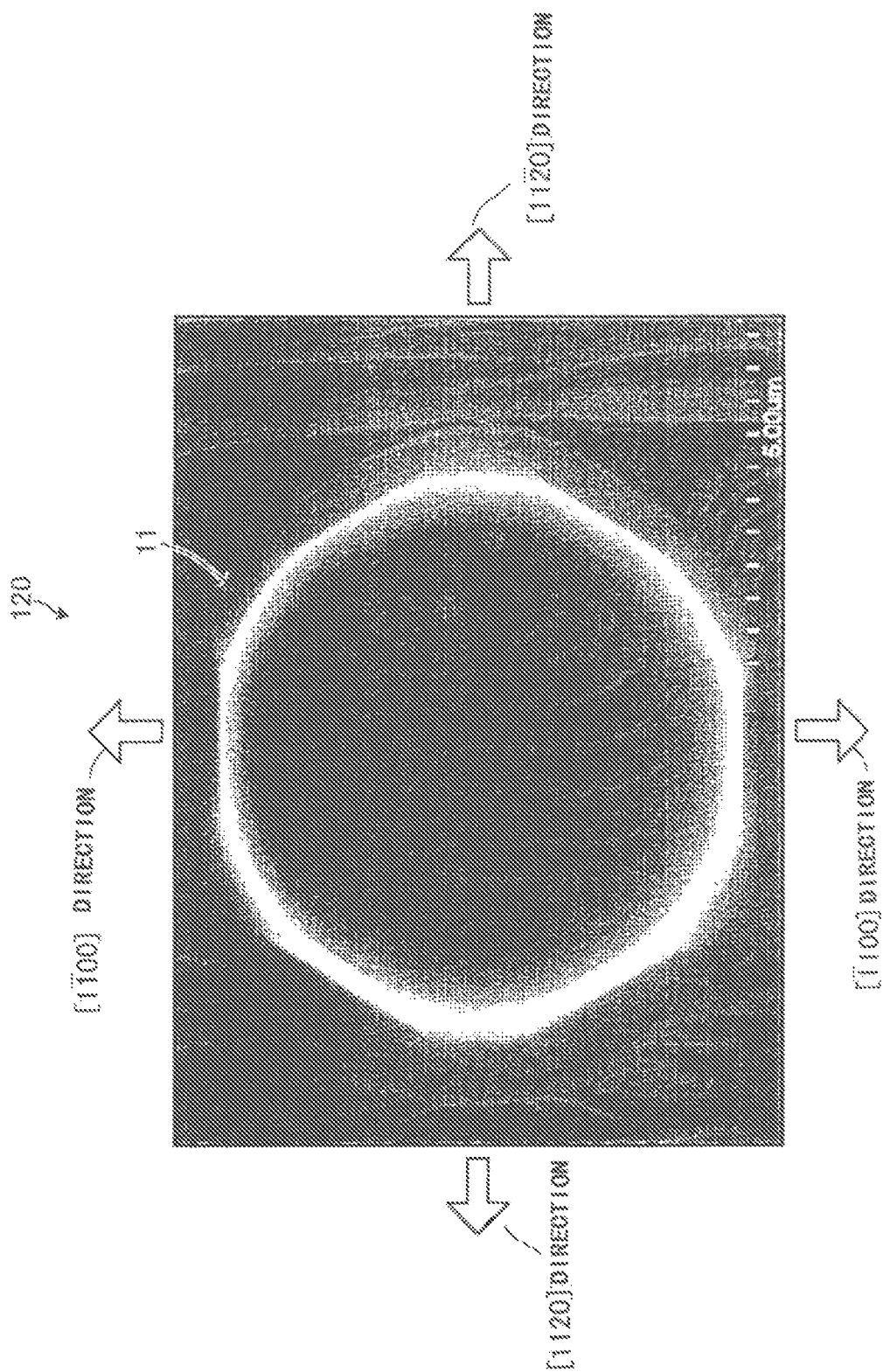
FIG. 4 is an electron micrograph observing the surface of the silicon carbide semiconductor device shown in FIG. 3 after the heat treatment thereof.

It is investigated how the trenches disposed on the SiC substrate are deformed by the teat treatment conducted at 1700° C. FIG. 3 is an electron micrograph observing the surface, in which a circular trench is disposed, of a silicon carbide semiconductor device before the heat treatment thereof. FIG. 4 is an electron micrograph observing the surface of the silicon carbide semiconductor device shown in FIG. 3 after the heat treatment thereof.

As shown in FIG. 3, trench 10 having an almost circular shape (hereinafter referred to as "circular trench 10") is formed on the (0001) C plane of SiC substrate 120. Circular trench 10 is shaped almost with the same curve in any of the directions such as the [11-20] direction, [1-100] direction, [-1100] direction, and [-1-120] direction of 4H—SiC.

SiC substrate 120 including circular trench 10 as described above is treated thermally at 1700° C. for 60 minutes. The manufacturing method for manufacturing SiC semiconductor device 120 and the conditions for forming the trench are the same as those for SiC semiconductor device 100 shown in FIG. 1.

It is found from FIG. 4 that circular trench 10 is deformed by the heat treatment conducted at 1700° C. The side wall of circular trench 10 extending at 15 degrees of angle, at 45 degrees of angle or at 75 degrees of angle with any of the [11-20] direction, [1-100] direction, [-1100] direction and [-1-120] direction of 4H—SiC is deformed and corners are caused on the side wall of circular trench 10. In contrast, the side wall of circular trench 10 extending at 30 degrees of angle, at 60 degrees of angle or at 90 degrees of angle with any of the [11-20] direction, [1-100] direction, [-1100] direction and [-1-120] direction of 4H—SiC is not deformed. In other words, it is found that circular trench 10 is deformed by the heat treatment conducted at 1700° C. to trench 11 having an almost dodecagonal shape (hereinafter referred to as "polygonal trench 11").

The formation of polygonal trench 11 may be attributed to the deformations of the trench side walls, the magnitudes of which change depending on the vigorousness of the vaporization, coagulation and surface diffusion of silicon and carbon (C) in the heat treatment. The vigorousness of the vaporization, coagulation and surface diffusion of silicon and carbon in the heat treatment further depends on the crystal planes with which the trench side walls coincide.

Figure 5:
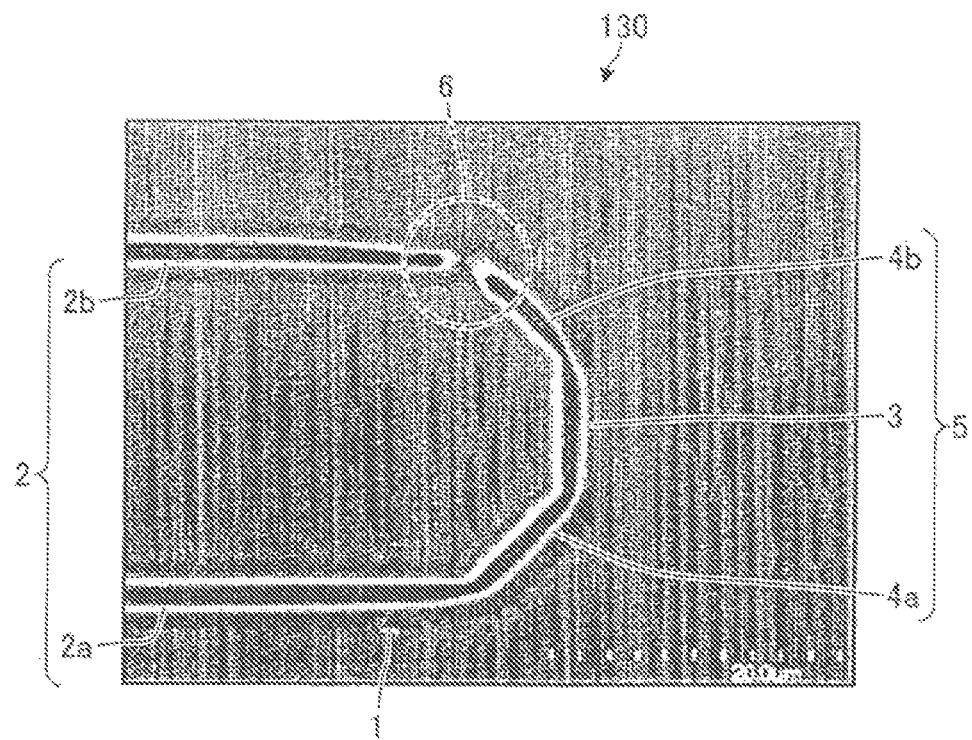
FIG. 5 is an electron micrograph observing surface of a silicon carbide semiconductor device according to a comparative example.

FIG. 5 is an electron micrograph observing the surface of a silicon carbide semiconductor device according to a comparative example.

Comparative SiC semiconductor device 130, in which the first and second connection angles are set at 45 degrees of angle, is formed and treated thermally. The manufacturing method for manufacturing SiC semiconductor device 130 and the conditions, under which trenches are formed, are the same as those for SiC semiconductor device 100 shown in FIG. 1. It is confirmed that the trench is filled in connection portion 6 between straight trench section 2 and connecting trench section 5. In other words, it is found that the trench is filled in the portion, in which a corner occurs on polygonal trench 11 shown in FIG. 4.

The observations described above indicate that the trench side walls are prevented from being deformed by the heat treatment conducted at 1500° C. or higher by shaping connecting trench section 5 with a combination of a straight connecting trench extending at 30 degrees of angle with straight trench section 2 and a straight connecting trench extending at 90 degrees of angle with straight trench section 2 or a combination of a straight connecting trench extending at 60 degrees of angle with straight trench section 2 and a straight connecting trench extending at 90 degrees of angle with straight trench section 2. Still alternatively, connecting trench section 5 may be shaped with a combination of a straight connecting trench extending at 30 degrees of angle with straight trench section 2, a straight connecting trench extending at 60 degrees of angle with straight trench section 2 and a straight connecting trench extending at 90 degrees of angle with straight trench section 2 for preventing the trench side walls from being deformed.

According to the first embodiment of the invention, trench 1 is formed in the SiC semiconductor device such that the end portions of the trenches constituting straight trench section 2 are connected with first connecting trench 3 via connecting trenches extending at 30 degrees of angle or at 60 degrees of angle with straight trench section 2. By forming trench 1 as described above, the trench side walls are hardly deformed and the trenches are prevented from being filled even by the heat treatment conducted at 1500° C. or higher. Since it is possible to manufacture an SiC semiconductor device that includes no end portions of the trenches, it is possible to prevent the electric field from localizing to the end portions of the trenches. Therefore, it is possible to prevent the SiC semiconductor device from being deteriorated or broken down.

Second Embodiment

Figure 6:
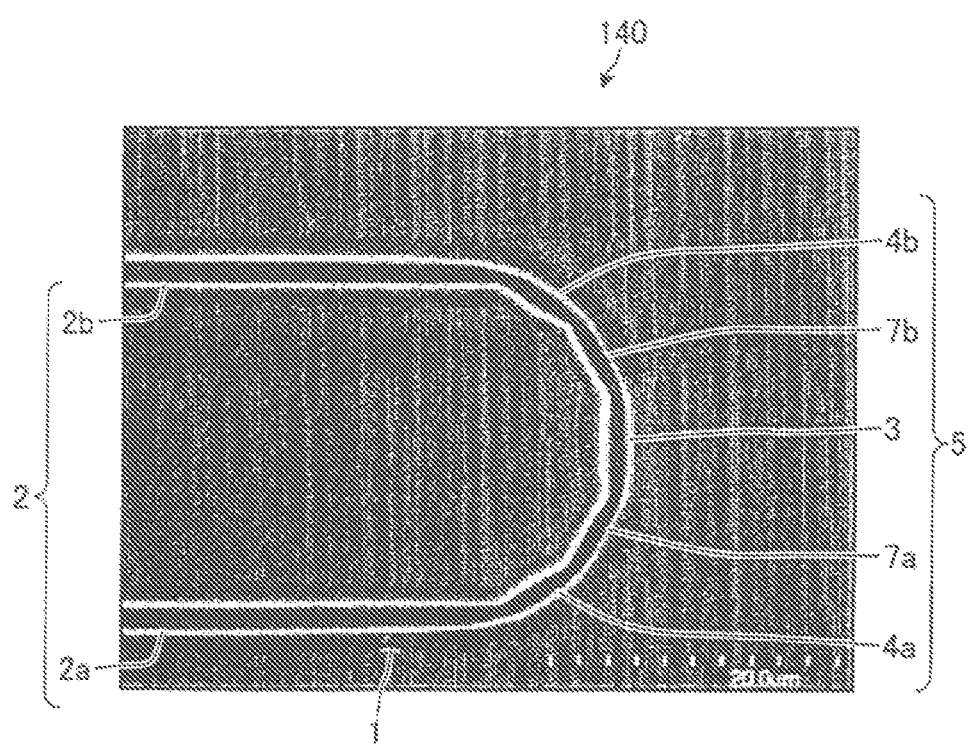
FIG. 6 is an electron micrograph that observes the surface of a silicon carbide semiconductor device according to a second embodiment of the invention.
Figure 7:
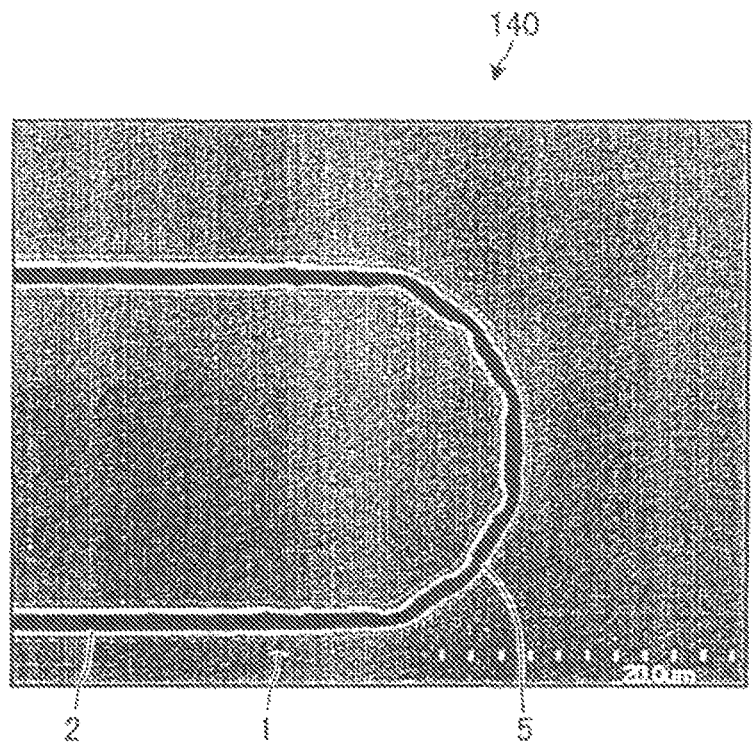
FIG. 7 is an electron micrograph that observes the surface of the silicon carbide semiconductor device shown in FIG. 6 before the heat treatment thereof.

FIG. 6 is an electron micrograph that observes the surface of a silicon carbide semiconductor device according to a second embodiment of the invention. FIG. 7 is an electron micrograph that observes the surface of the silicon carbide semiconductor device shown in FIG. 6 before the heat treatment thereof.

The SiC semiconductor device according to the second embodiment may be obtained by adding fourth and fifth connecting trenches to connecting trench section 5 of the SiC semiconductor device according to the first embodiment.

In SiC semiconductor device 140 according to the second embodiment, second connecting trench 4a connects the end portion of first straight trench 2a and the first end portion of fourth connecting trench 7a. The second end portion of fourth connecting trench 7a is connected to the first end portion of first connecting trench 3. Third connecting trench 4b connects the end portion of second straight trench 2b and the first end portion of fifth connecting trench 7b. The second end portion of fifth connecting trench 7b is connected to the second end portion of first connecting trench 3. Fourth and fifth connecting trenches 7a and 7b correspond to a fourth trench section.

The first and second connection angles are 30 degrees of angle. Fourth connecting trench 7a is extended such that the angle between the extension of first straight trench 2a and fourth connecting trench 7a measured from the extension of first straight trench 2a toward the inside of straight trench section 2 (hereinafter referred to as the "third connection angle") is 60 degrees of angle. Fifth connecting trench 7b is extended such that the angle between the extension of second straight trench 2b and fifth connecting trench 7b measured from the extension of second straight trench 2b toward the inside of straight trench section 2 (hereinafter referred to as the "fourth connection angle") is 60 degrees of angle. In other words, connecting trench section 5 in the SiC semiconductor device according to the second embodiment is shaped with half the circumference of a dodecagon. The other structure in SiC semiconductor device 140 according to the second embodiment is the same as that of SiC semiconductor device 100 according to the first embodiment.

For the light exposure in manufacturing SiC semiconductor device 140, a reticle, in which a trench pattern, 1.5 μm in width, is formed, is employed. Since side etching occurs, the resulting trench width is 2 μm. The other details of manufacturing SiC semiconductor device 140 are the same as those of manufacturing the SiC semiconductor device according to the first embodiment.

As described above, the manufacturing method for manufacturing the SiC semiconductor device according to the second embodiment exhibits the effects same as those of the manufacturing method according to the first embodiment.

Third Embodiment

Figure 8:
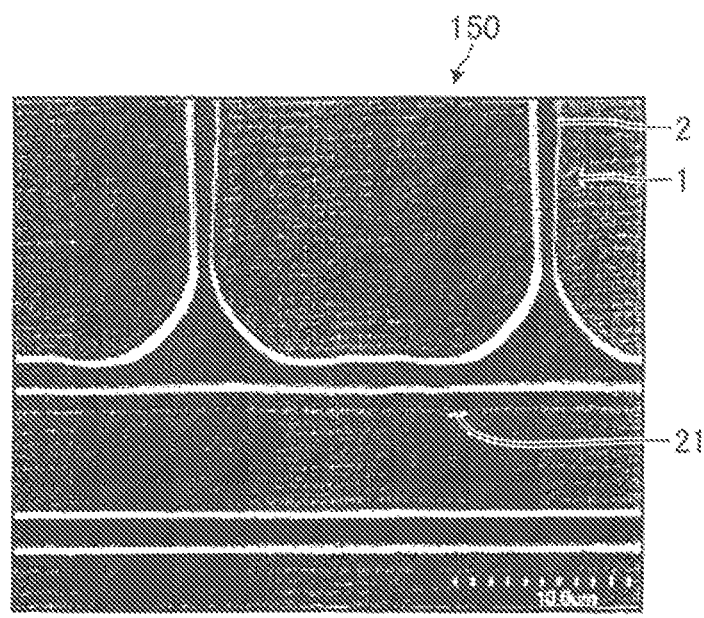
FIG. 8 is an electron micrograph that observes the surface of a silicon carbide semiconductor device according to a third embodiment of the invention.
Figure 9:
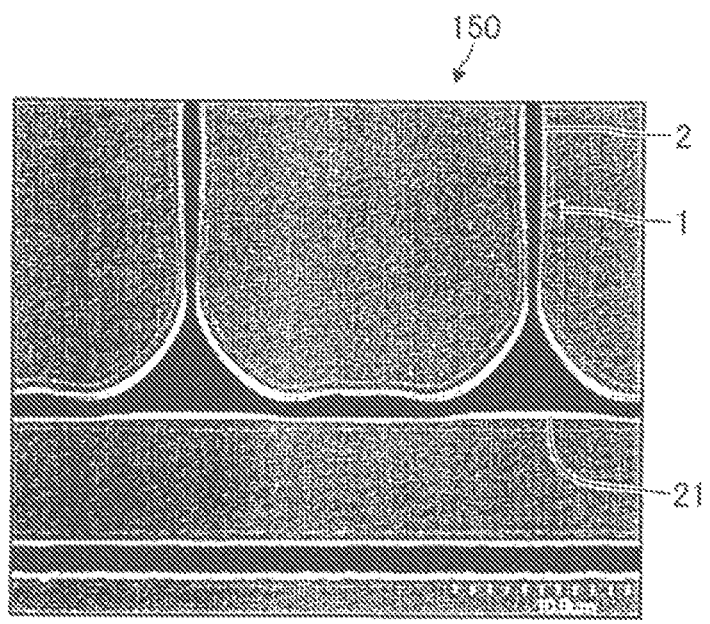
FIG. 9 is an electron micrograph that observes the surface of the silicon carbide semiconductor device shown in FIG. 8 before the heat treatment thereof.

FIG. 8 is an electron micrograph that observes the surface of a silicon carbide semiconductor device according to a third embodiment of the invention. FIG. 9 is an electron micrograph that observes the surface of the silicon carbide semiconductor device shown in FIG. 8 before the heat treatment thereof.

The manufacturing method for manufacturing SiC semiconductor device 150 and the conditions under which trenches are formed are the same as those for SiC semiconductor device 100 according to the first embodiment. It is effective to dispose a vertical and straight connecting trench extending vertically to straight trench section 2 (hereinafter referred to as a "vertical straight connecting trench") in substitution for connecting trench section 5 in the SiC semiconductor device 100 according to the first embodiment. The end portion formed inside trench 1 by straight trench section 2 and the vertical straight connecting trench is set to be polygonal. The widths of the end portions of the trenches constituting straight trench section 2 are made to be wider gradually from straight trench section 2 toward the vertical straight connecting trench.

Straight trench section 2 is arranged, for example, in a stripe pattern. Vertical straight connecting trench 21 is disposed vertically to straight trench section 2. For example, all the straight trench sections 2 are connected to vertical straight connecting trench 21. The shapes of the end portions inside trench 1 formed by the side walls of straight trench sections 2 and the inner side wall of vertical straight connecting trench 21 continuous to the side walls of straight trench sections 2 is polygonal. The end portions of the trenches constituting straight trench sections 2 become wider gradually from the side of straight trench sections 2 toward vertical straight connecting trench 21. The other structure of the SiC semiconductor device according to the third embodiment is the same as that of the SiC semiconductor device according to the first embodiment. Vertical straight connecting trench 21 corresponds to a fifth trench section.

The shapes of the end portions inside trench 1 may be the same as the shape of the connecting trench section (cf. FIG. 1) according to the first embodiment or the second embodiment with no problem.

For the light exposure in manufacturing SiC semiconductor device 150, a reticle, in which a trench pattern, 1.5 μm in width, is formed, is employed. Since side etching occurs, the resulting trench width is 2 μm. The other details of manufacturing SiC semiconductor device 150 is the same as those of manufacturing the SiC semiconductor device according to the first embodiment.

The SiC semiconductor device shown in FIG. 8 facilitates preventing trench 1 from being filled, even if the SiC semiconductor device were treated thermally at 1700° C., since the end portion of trench 1 is polygonal and since the trenches constituting straight trench section 2 are widened gradually from the side of straight trench section 2 to the side of vertical straight connecting trench 21. It is found that the trench in SiC semiconductor device 150 before the heat treatment thereof shown in FIG. 9 is narrowed locally in the connection portion between straight trench section 2 and vertical straight connecting trench 21. In contrast, it is confirmed that the trenches are not filled in SiC semiconductor device 150 after the heat treatment thereof shown in FIG. 8.

As described above, the manufacturing method for manufacturing the SiC semiconductor device according to the third embodiment exhibits the same effects as those of the manufacturing method according to the first embodiment.

Fourth Embodiment

Figure 15:
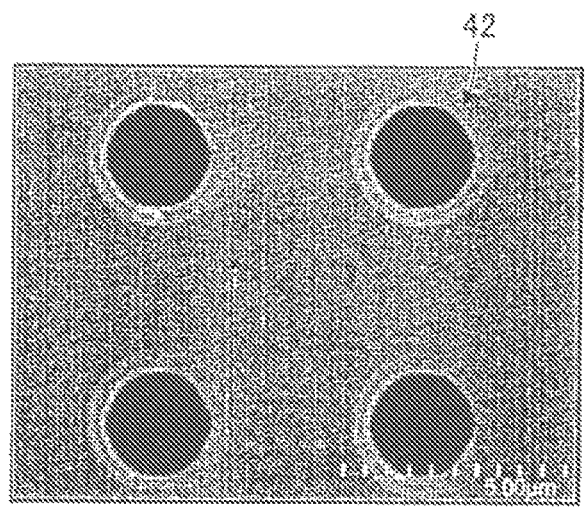
FIG. 15 is an electron micrograph observing the surface of a trench formed to be circular before the heat treatment thereof.
Figure 16:
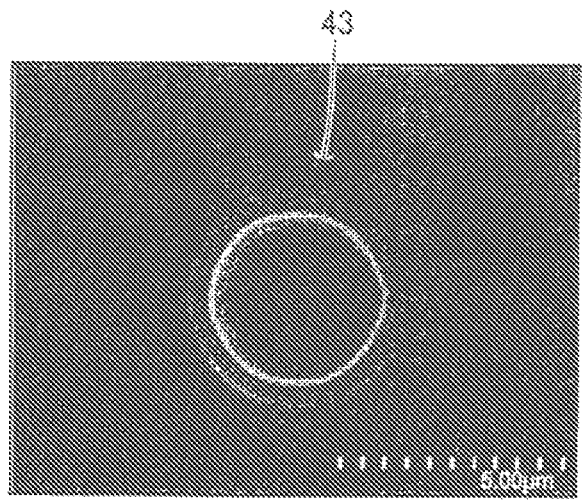
FIG. 16 is an electron micrograph observing the surface of a trench formed to be circular before the heat treatment thereof.
Figure 17:
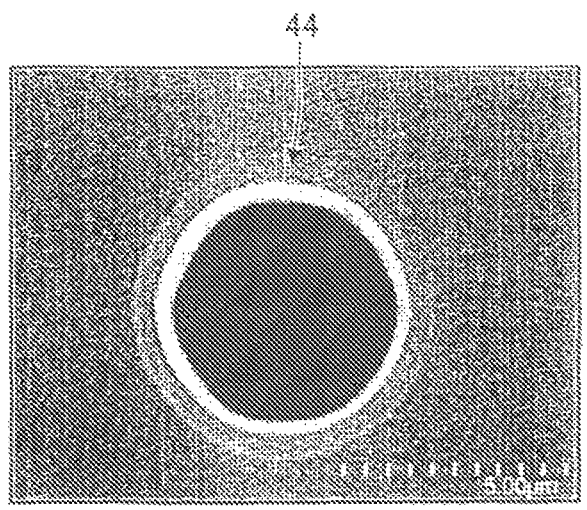
FIG. 17 is an electron micrograph observing the surface of a trench formed to be circular before the heat treatment thereof.
Figure 18:
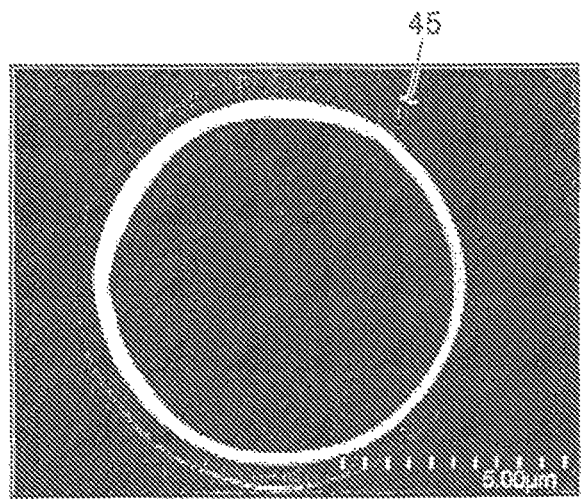
FIG. 18 is an electron micrograph observing the surface of a trench formed to be circular before the heat treatment thereof.
Figure 19:
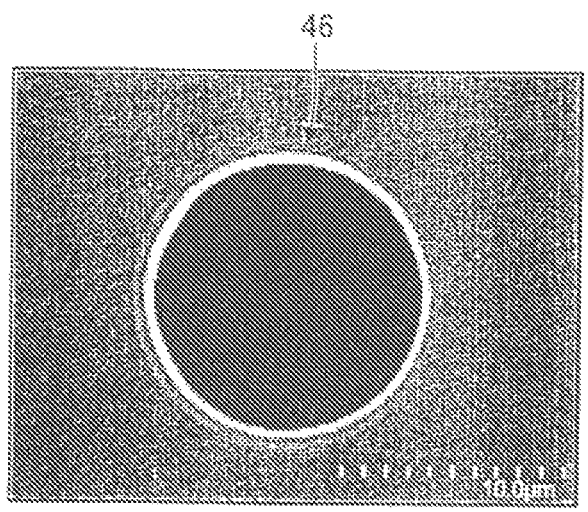
FIG. 19 is an electron micrograph observing the surface of a trench formed to be circular before the heat treatment thereof.
Figure 20:
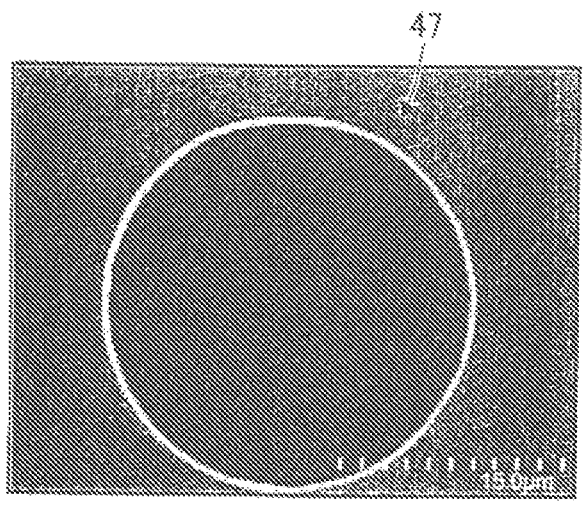
FIG. 20 is an electron micrograph observing the surface of a trench formed to be circular before the heat treatment thereof.
Figure 21:
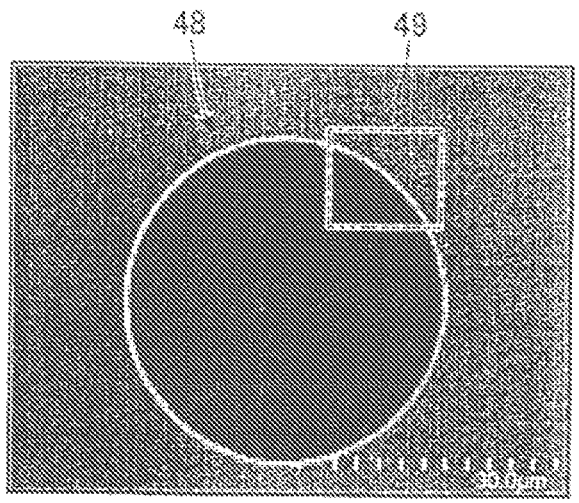
FIG. 21 is an electron micrograph observing the surface of a trench formed to be circular before the heat treatment thereof.

FIGS. 10 through 13 are electron micrographs that observe the surface of a silicon carbide semiconductor device according to a fourth embodiment of the invention. In trenches 1 shown in these drawings, the spacing between first and second straight trenches 2a and 2b (hereinafter referred to as the "cell pitch") constituting straight trench section 2 is set at 3.8 μm in FIG. 10, 6.5 μm in FIG. 11, 10 μm in FIG. 12, and 15 μm in FIG. 13. The polygonal shape of connecting trench section 5 may be changed depending on the cell pitch in straight trench section 2 with no problem.

Figure 10:
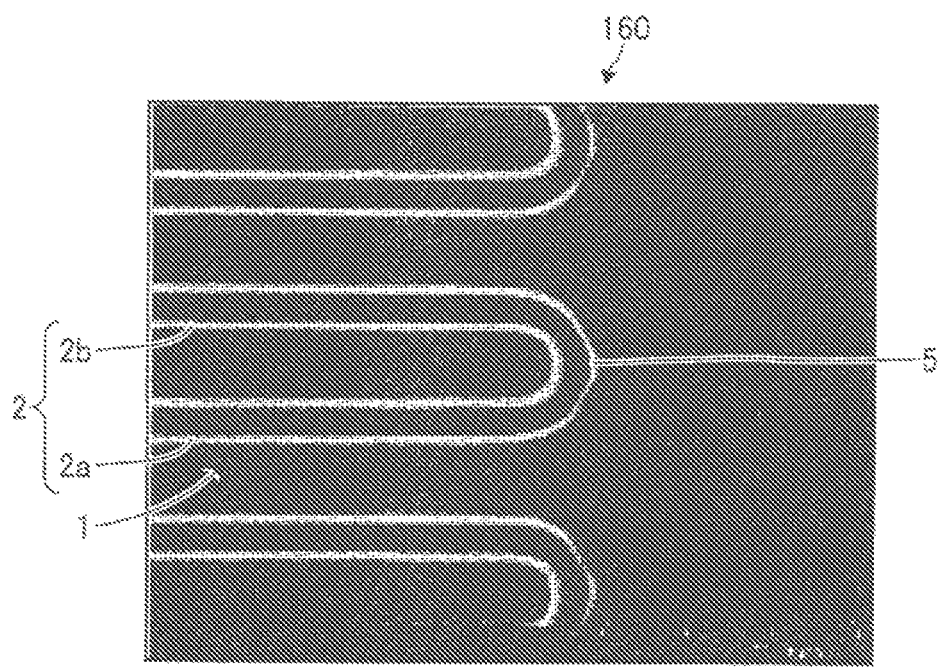
FIG. 10 is an electron micrograph that observes the surface of a silicon carbide semiconductor device according to a fourth embodiment of the invention, in which the cell pitch is set at 3.8 µm.

As shown in FIG. 10, connecting trench section 5 in SiC semiconductor device 160 is shaped with half the circumference of a hexagon. In other words, the structure of SiC semiconductor device 160 is the same as the structure of SiC semiconductor device 100 according to the first embodiment (cf. FIG. 1). It is preferable for the cell pitch in straight trench section 2 to be from 1.7 μm to 2.5 μm. The reason for this will be described later.

Figure 11:
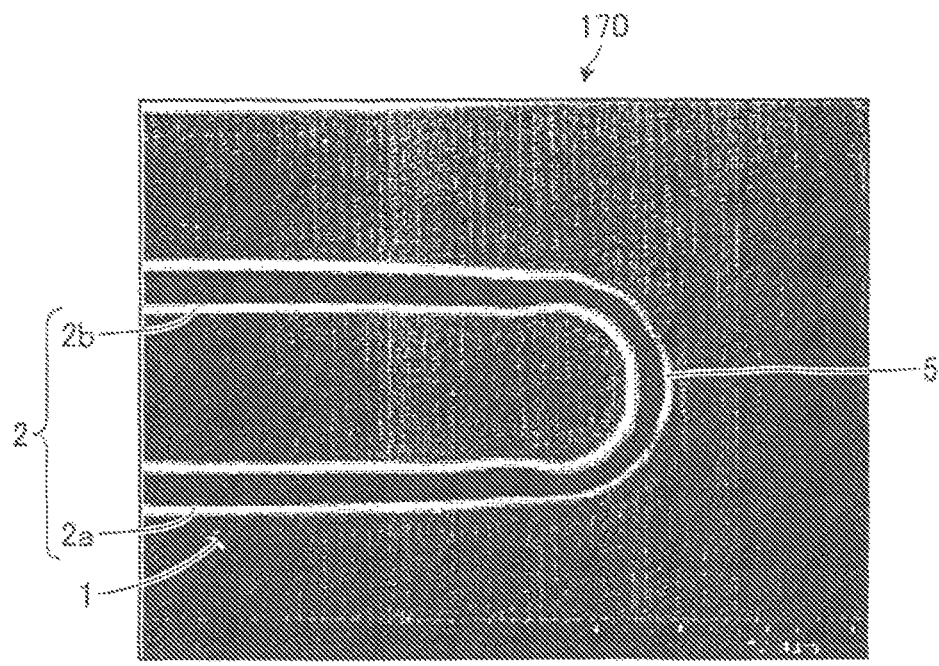
FIG. 11 is an electron micrograph that observes the surface of a silicon carbide semiconductor device according to the fourth embodiment of the invention, in which the cell pitch is set at 6.5 µm.

As shown in FIG. 11, connecting trench section 5 in SiC semiconductor device 170 is shaped with half the circumference of a dodecagon. In other words, the structure of SiC semiconductor device 170 is the same as the structure of SiC semiconductor device 140 according to the second embodiment (cf. FIG. 7). It is preferable for the cell pitch in straight trench section 2 to be from 4 µm to 5.6 µm. The reason for this will be described later.

Figure 12:
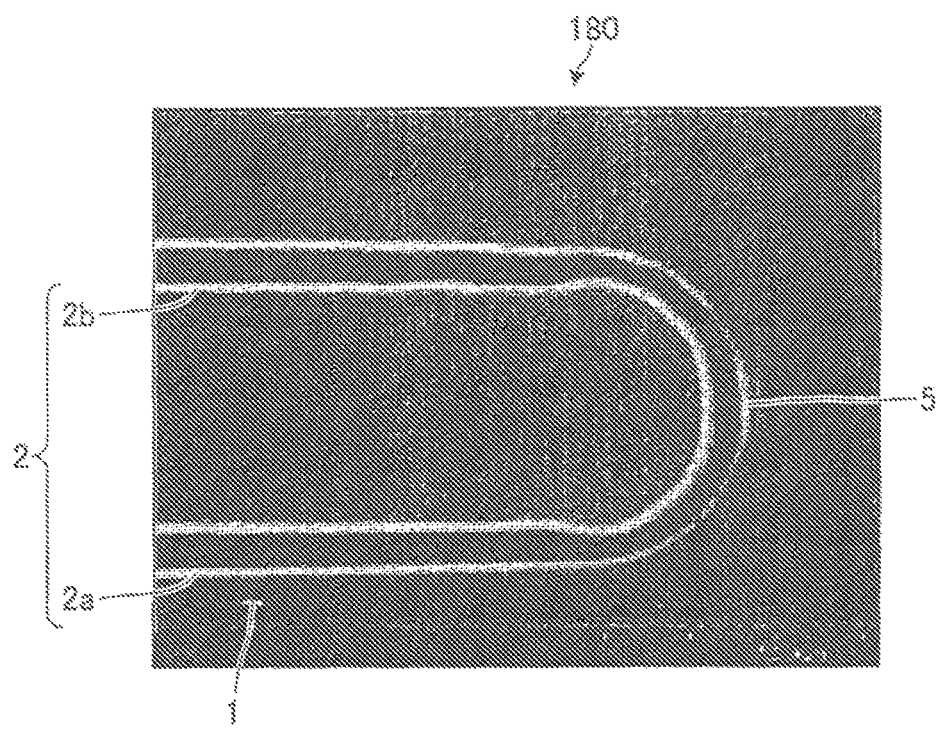
FIG. 12 is an electron micrograph that observes the surface of a silicon carbide semiconductor device according to the fourth embodiment of the invention, in which the cell pitch is set at 10 µm.

As shown in FIG. 12, connecting trench section 5 in SiC semiconductor device 180 is shaped with half the circumference of an octadecagon. In other words, SiC semiconductor device 180 has more connecting trenches than connecting trench section 5 in SiC semiconductor device 170 (cf. FIG. 11). In detail, connecting trench section 5 in SiC semiconductor device 180 is shaped with a polygon connecting 9 line segments to each other.

In SiC semiconductor device 180, the angles between the connecting trenches constituting connecting trench section 5 and straight trench section 2 are as follows. The angles between the connecting trenches, including the second connecting trench connected to first straight trench 2a and the first connecting trench vertical to first straight trench 2a, and first straight trench 2a measured from the extension of first straight trench 2a toward the inside of straight trench section 2 are 20 degrees of angle, 40 degrees of angle, 60 degrees of angle, and 80 degrees of angle.

The angles between the connecting trenches, including the third connecting trench connected to second straight trench 2b and the first connecting trench vertical to second straight trench 2b, and second straight trench 2b measured from the extension of second straight trench 2b toward the inside of straight trench section 2 are 20 degrees of angle, 40 degrees of angle, 60 degrees of angle, and 80 degrees of angle.

The other structure of SiC semiconductor device 180 is the same as that of SiC semiconductor device 170. The connecting trenches extending at 20 degrees of angle, 40 degrees of angle, 60 degrees of angle, and 80 degrees of angle with the extension of straight trench section 2 correspond to the sixth trench section, the seventh trench section, the fourth trench section and the eighth trench section, respectively. In this case, it is preferable for the cell pitch in straight trench section 2 to be from 8 µm to 12 µm. The reason for this will be described later.

Figure 13:
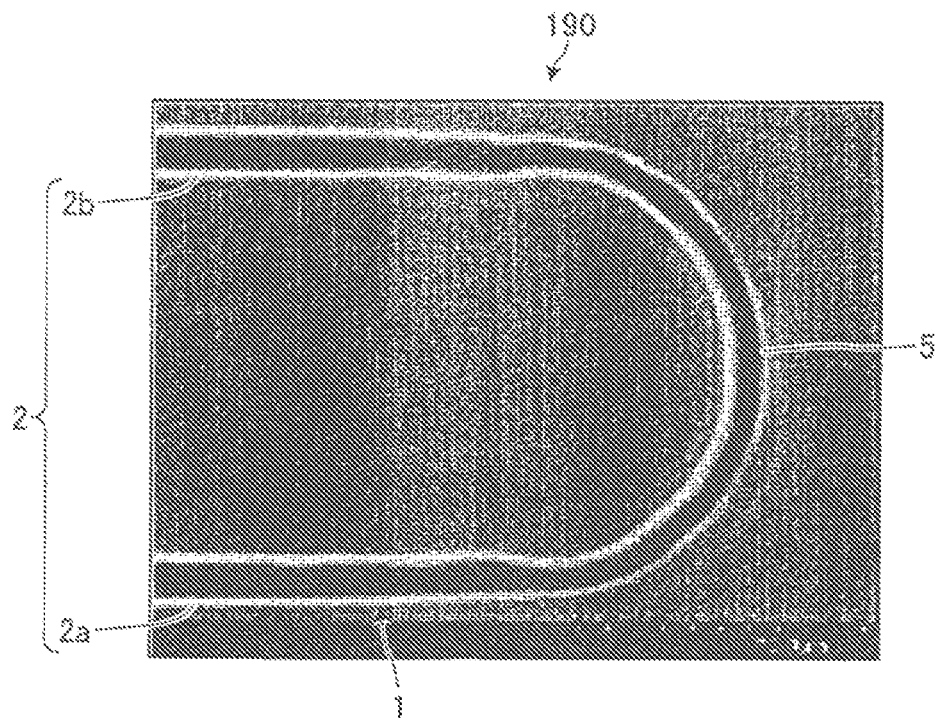
FIG. 13 is an electron micrograph that observes the surface of a silicon carbide semiconductor device according to the fourth embodiment of the invention, in which the cell pitch is set at 15 µm.
Figure 14:
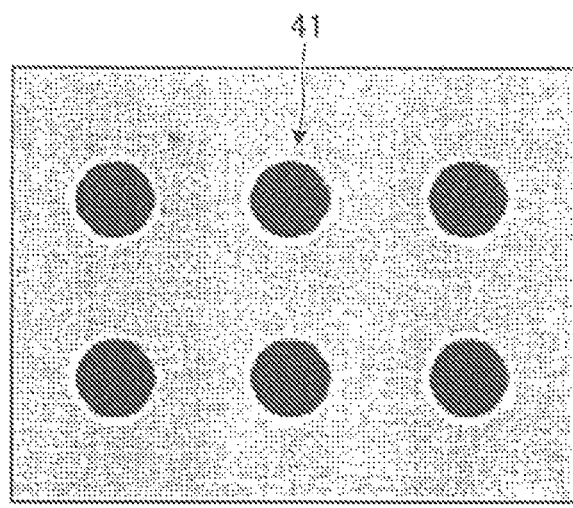
FIG. 14 is an electron micrograph observing the surface of a trench formed to be circular before the heat treatment thereof.

As shown in FIG. 13, connecting trench section 5 in SiC semiconductor device 190 is shaped with half the circumference of a triacontagon. In other words, SiC semiconductor device 190 has more connecting trenches than connecting trench section 5 in SiC semiconductor device 180 (cf. FIG. 12). In detail, connecting trench section 5 in SiC semiconductor device 190 is shaped with a polygon connecting 16 line segments to each other.

In SiC semiconductor device 190, the angles between the connecting trenches constituting connecting trench section 5 and straight trench section 2 are as follows. The angles between the connecting trenches, including the second connecting trench connected to first straight trench 2a and the first connecting trench vertical to first straight trench 2a, and first straight trench 2a measured from the extension of first straight trench 2a toward the inside of straight trench section 2 are 11.25 degrees of angle, 22.5 degrees of angle, 33.75 degrees of angle, 45 degrees of angle, 56.25 degrees of angle, 67.5 degrees of angle, and 78.75 degrees of angle.

The angles between the connecting trenches, including the third connecting trench connected to second straight trench 2b and the first connecting trench vertical to second straight trench 2b, and second straight trench 2b measured from the extension of second straight trench 2b toward the inside of straight trench section 2 are 11.25 degrees of angle, 22.5 degrees of angle, 33.75 degrees of angle, 45 degrees of angle, 56.25 degrees of angle, 67.5 degrees of angle, and 78.75 degrees of angle.

The other structure of SiC semiconductor device 190 is the same as that of SiC semiconductor device 180. The connecting trenches extending at 11.25 degrees of angle, 22.5 degrees of angle, 33.75 degrees of angle, 45 degrees of angle, 56.25 degrees of angle, 67.5 degrees of angle, and 78.75 degrees of angle with the extension of straight trench section 2 correspond to the ninth through fifteenth trench sections, respectively. In this case, it is preferable for the cell pitch in straight trench section 2 to be 12 µm or wider. The reason for this will be described later.

For the light exposure in manufacturing the SiC semiconductor device according to the fourth embodiment, a reticle in which a trench pattern 1.5 µm in width is formed is employed. The resulting trench width is set to be 1.5 µm by the trench etching. Any first bake is not conducted. A second bake is conducted at 125° C. for 15 minutes. The heat treatment conducted on trench 1 after the formation thereof is a general heat treatment for improving the trench shape and for activating the implanted atoms. The general heat treatment is conducted at 1700° C. for 10 minutes. The other details of manufacturing the SiC semiconductor device according to the fourth embodiment are the same as those of manufacturing the SiC semiconductor device according to the first embodiment.

Figure 22:
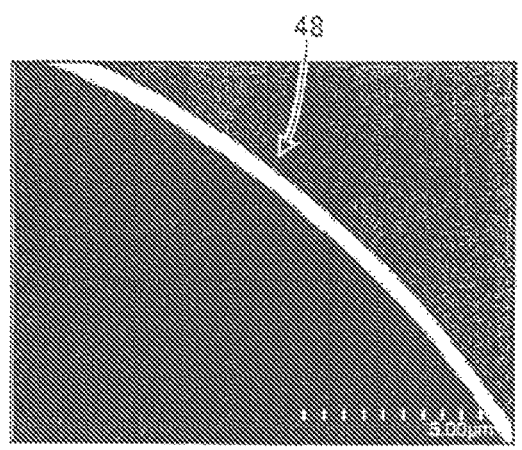
FIG. 22 is an electron micrograph observing the surface of a part of the trench shown in FIG. 21.
Figure 23:
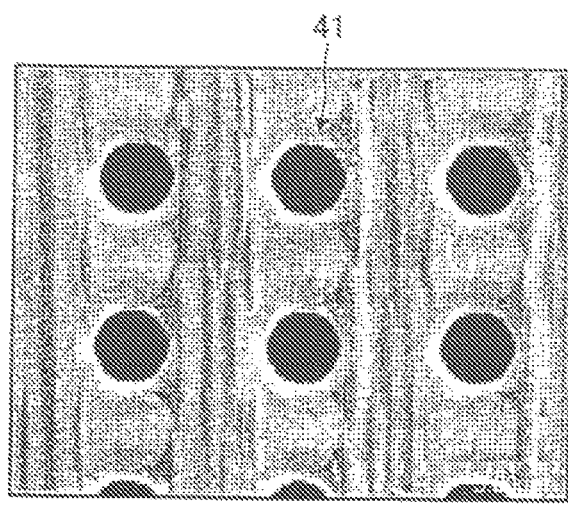
FIG. 23 is an electron micrograph observing the surface of the trench shown in FIG. 14 after the heat treatment thereof.
Figure 24:
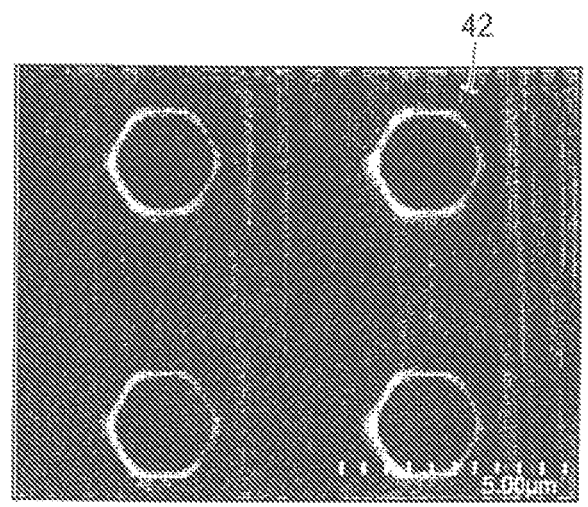
FIG. 24 is an electron micrograph observing the surface of the trench shown in FIG. 15 after the heat treatment thereof.
Figure 25:
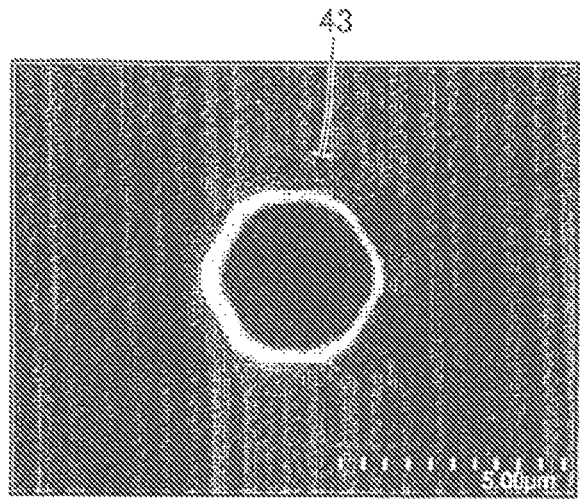
FIG. 25 is an electron micrograph observing the surface of the trench shown in FIG. 16 after the heat treatment thereof.
Figure 26:
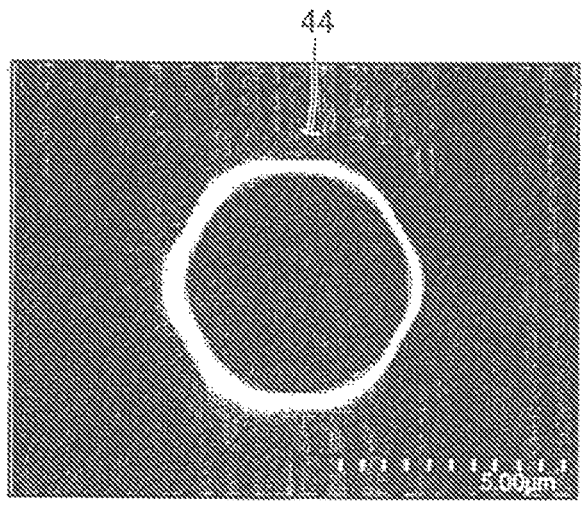
FIG. 26 is an electron micrograph observing the surface of the trench shown in FIG. 17 after the heat treatment thereof.
Figure 27:
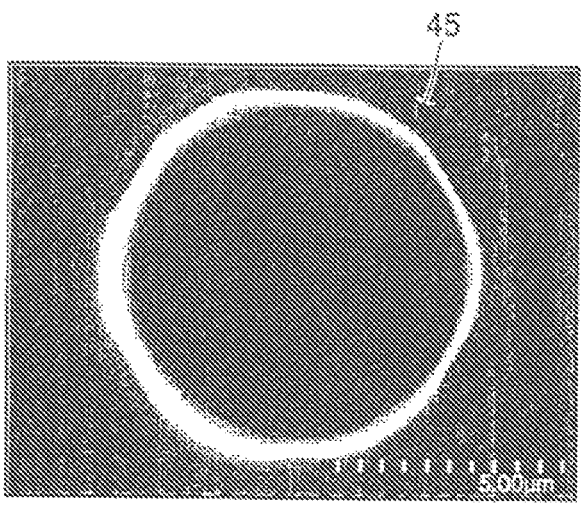
FIG. 27 is an electron micrograph observing the surface of the trench shown in FIG. 18 after the heat treatment thereof.
Figure 28:
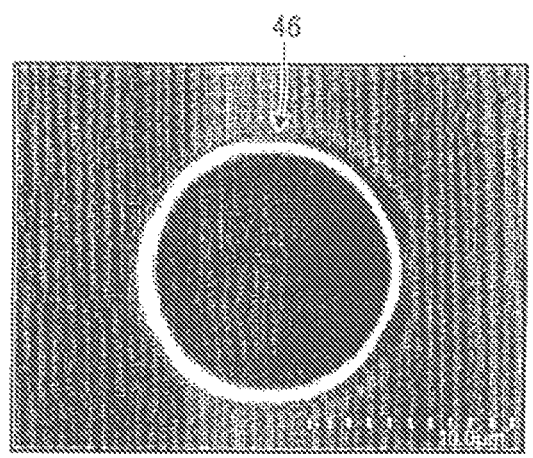
FIG. 28 is an electron micrograph observing the surface of the trench shown in FIG. 19 after the heat treatment thereof.
Figure 29:
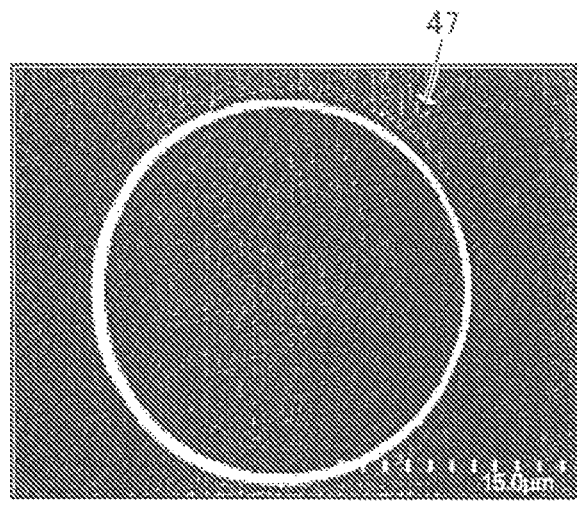
FIG. 29 is an electron micrograph observing the surface of the trench shown in FIG. 20 after the heat treatment thereof.
Figure 30:
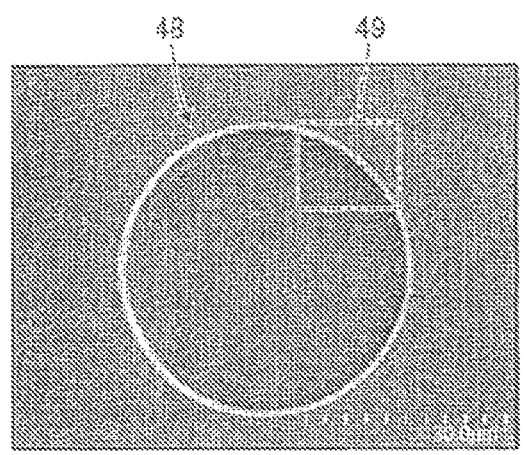
FIG. 30 is an electron micrograph observing the surface of the trench shown in FIG. 21 after the heat treatment thereof.
Figure 31:
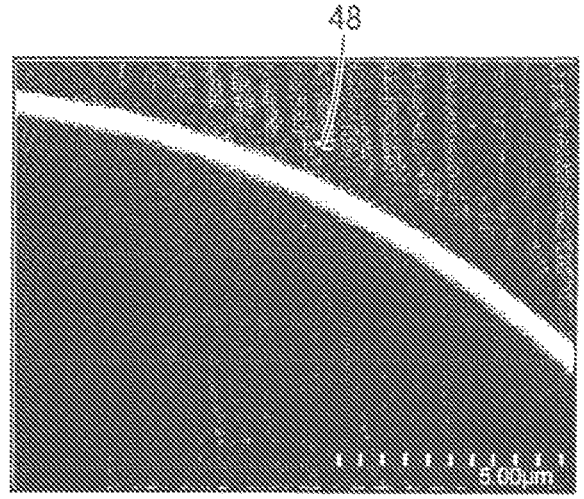
FIG. 31 is an electron micrograph observing the surface of a part of the trench shown in FIG. 30.

It is investigated how connecting trench section 5 is deformed by the heat treatment conducted at 1500° C. depending on the cell pitch in straight trench section 2. FIGS. 14 through 21 are electron micrographs observing the surfaces of trenches formed to be circular before the heat treatment thereof. FIG. 22 is an electron micrograph observing the surface of a part of the trench shown in FIG. 21 before the heat treatment thereof. FIGS. 23 through 30 are electron micrographs observing the surfaces of the trenches shown in FIGS. 14 through 21 after the heat treatment thereof. FIG. 31 is an electron micrograph observing the surface of a part of the trench shown in FIG. 30. FIG. 32 is a table describing the curvatures of circular trenches and the shapes of the trenches before and after the heat treatment thereof. The table described in FIG. 32 summarizes the results shown in FIGS. 14 through 31.

The distances corresponding to the diameters of the circular patterns described in FIG. 32 assume the cell pitches in straight trench section 2. The trench shapes described in FIG. 32 assume the shapes of connecting trench sections 5 after the trench etching and after the heat treatment.

By the manufacturing method according to the fourth embodiment, trenches, the sizes of which differ from each other as shown in FIGS. 14 through 21 (hereinafter referred to as "first specimen 41 through eighth specimen 48"), are formed on SiC substrates. The specimens are obtained using circular trench patterns, the diameters of which differ from each other (hereinafter referred to simply as "circular patterns") as circular trenches, the curvatures thereof are different from each other. The diameters of the circular patterns for first through eighth specimens 41 through 48 are 1.7 µm, 2.5 µm, 4 µm, 5.6 µm, 8 µm, 12 µm, 26 µm, and 48 µm, respectively. These trenches have a cross sectional shape as shown in FIG. 3. The heat treatment is conducted in an argon gas, to which monosilane is added at the flow rate ratio of 0.4%, under the pressure of 80 Torr and at 1700° C. for 10 minutes.

As the results shown in FIGS. 14 through 21 indicate, the shapes of the specimens formed to be circular trenches are deformed as described below. First through third specimens 41 through 43 are deformed to be hexagonal. Fourth specimen 44 and fifth specimen 45 are deformed to be dodecagonal. Sixth specimen 46 is deformed to an octadecagon. Seventh specimen 47 is deformed to a triacontagon. Eighth specimen 48 is shaped almost with a circle as the expanded view of end portion 49 of a trench opening shows (cf. FIG. 22).

It is found from these results that if a circular trench, the diameter of which is 26 μm or shorter, is formed, the trench shape after the trench etching will be polygonal. The reason for this is that the etching speed depends on the crystal plane of the SiC semiconductor device (due to the crystal plane dependence of the etching speed). In other words, it is found that the trench side walls in the specimens shown in FIGS. 14 through 21 are hardly deformed by etching. It is found that the trench is shaped with a polygon having more corners after etching, as the curvature of the circular trench is larger. In other words, it is found that the crystal planes hardly deformed by etching are different depending on the curvature of the circular trench. It is found that the crystal planes hardly deformed by etching increase as the curvature of the circular trench is larger.

It is found from the results shown in FIGS. 23 through 30 that the shapes of the specimens formed to be circular trenches are not deformed by the heat treatment or deformed by the heat treatment to a polygon. First and second specimens 41 and 42 are not deformed but maintain the hexagonal shape. Third specimen 43 is deformed to be dodecagonal. Fourth specimen 44 is not deformed but maintains the dodecagonal shape. Fifth specimen 45 is deformed to an octadecagon. Sixth specimen 46 is not deformed but maintains the octadecagonal shape. Seventh specimen 47 is not deformed but maintains a triacontadigonal shape. Eighth specimen 48 is not deformed but shaped almost with a circle as the expanded view of end portion 49 of a trench opening shows (cf. FIG. 31).

It is found from the results shown in FIGS. 23 through 30 that some of the trenches formed to be circular are not deformed by the heat treatment but that the other trenches formed to be circular change the shapes thereof to a polygon having more corners. The reason why the trench side wall is deformed to a polygonal shape by the heat treatment is the same as the reason according to the first embodiment. In other words, it is found that the specimens shown in FIGS. 23 through 30 include a trench side wall that coincides with the crystal plane hardly deformed by a heat treatment. It is found that the trench is shaped by a heat treatment with a polygon having more corners, as the curvature of a circular trench is larger. In other words, it is found that the crystal plane that is hardly deformed by a heat treatment changes depending on the curvature of the circular trench. And, it is found that the trench side wall coincides with more crystal planes hardly deformed by a heat treatment, as the curvature of the circular trench is larger.

Therefore, it is found that it is possible to prevent a trench from being deformed by a heat treatment by shaping the trench with a polygon having crystal planes that are hardly deformed by the heat treatment. It is found that it is preferable to assume a circular trench having a diameter of 4 μm after etching, for example, by a dodecagon that is the shape of the trench after the heat treatment thereof.

It is preferable to determine the polygonal shape of a trench after the etching thereof so that the shape of the trench after the heat treatment thereof may be the same as the shape of the trench after the etching thereof. By shaping the trench as described above, trench deformations can be reduced through the steps for forming the trench in the SiC semiconductor device. It is found that if a circular trench, the diameter of which is 1.7 μm, is approximated by a hexagonal trench, the shape thereof will not change before and after the heat treatment thereof.

It is found from these results that connecting trench section 5 is hardly deformed by heat treatment by shaping connecting trench section 5 with half the circumference of a hexagon, when the cell pitch in straight trench section 2 is from 1.7 μm to 2.5 μm. When the cell pitch in straight trench section 2 is from 4 μm to 5.6 μm, connecting trench section 5 shaped with half the circumference of a dodecagon is hardly deformed by a heat treatment. When the cell pitch in straight trench section 2 is from 8 μm to 12 μm, connecting trench section 5 shaped with half the circumference of an octadecagon is hardly deformed by heat treatment. When the cell pitch in straight trench section 2 is 12 μm or longer, connecting trench section 5 shaped with half the circumference of a triacontagon is hardly deformed by a heat treatment.

As described above, the manufacturing method for manufacturing an SiC semiconductor device according to the fourth embodiment exhibits the effects the same as those of the manufacturing method according to the first embodiment. Depending on the cell pitch, connecting trench section 5 is shaped with a polygonal trench (that is half the circumference of a hexagon, half the circumference of a dodecagon, half the circumference of an octadecagon, or half the circumference of a triacontagon) having side walls which coincide with the crystal planes hardly deformed by a heat treatment. If the SiC semiconductor device according to the fourth embodiment is treated thermally at 1500° C. or higher, the trench side walls will be hardly deformed and the trenches will be prevented from being filled at various cell pitches.

Figure 33:
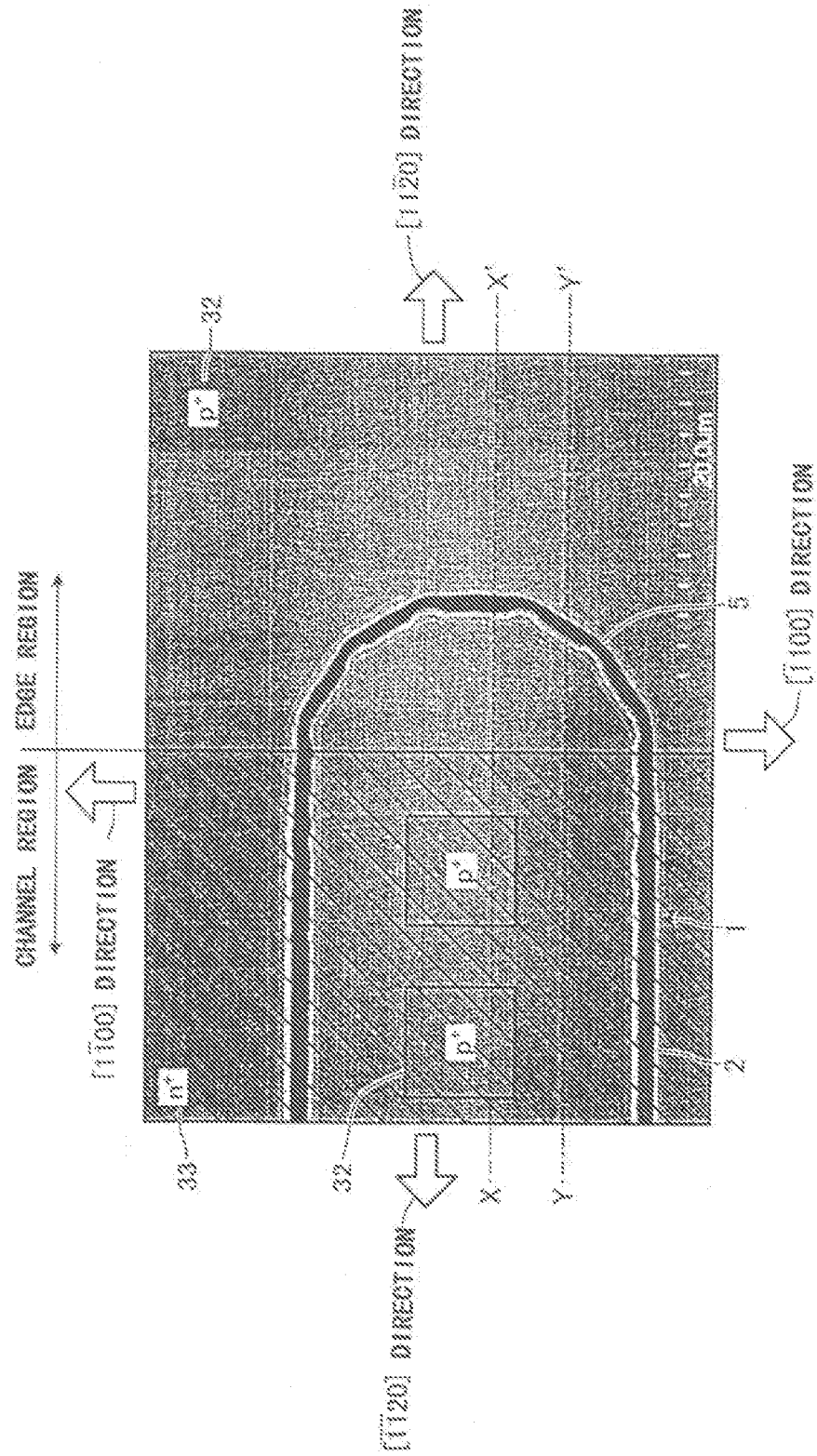
FIG. 33 is an electron micrograph schematically showing a silicon carbide semiconductor device according to the invention.
Figure 96:
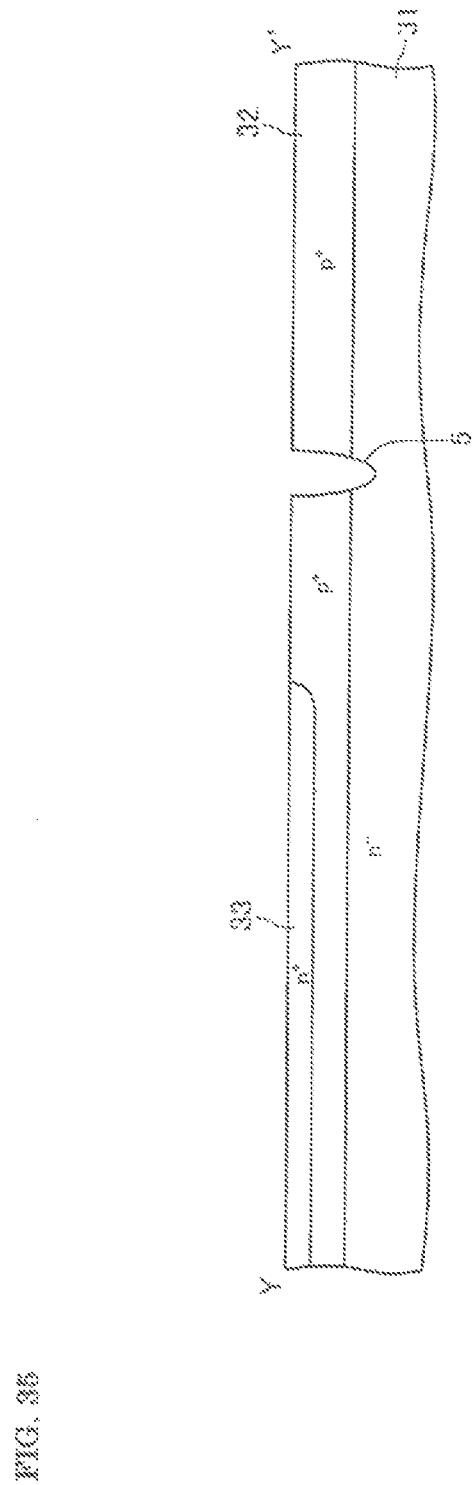
Figure 36:
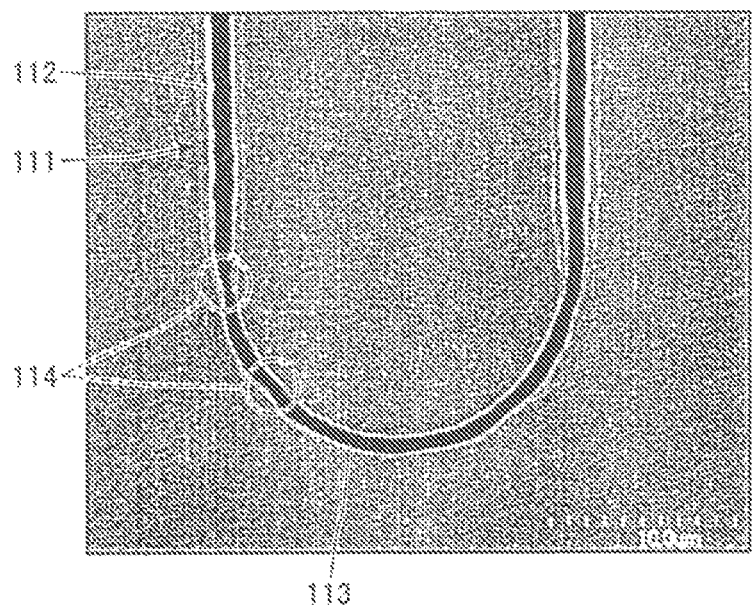
FIG. 36 is an electron micrograph that observes a conventional silicon carbide semiconductor device before the heat treatment thereof from the surface side thereof.
Figure 37:
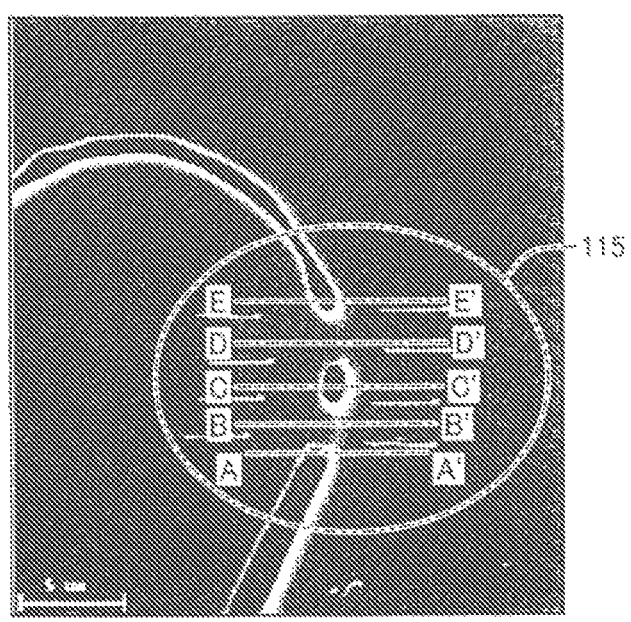
FIG. 37 is an electron micrograph that observes the conventional silicon carbide semiconductor device after the heat treatment thereof from the surface side thereof.
Figure 38:
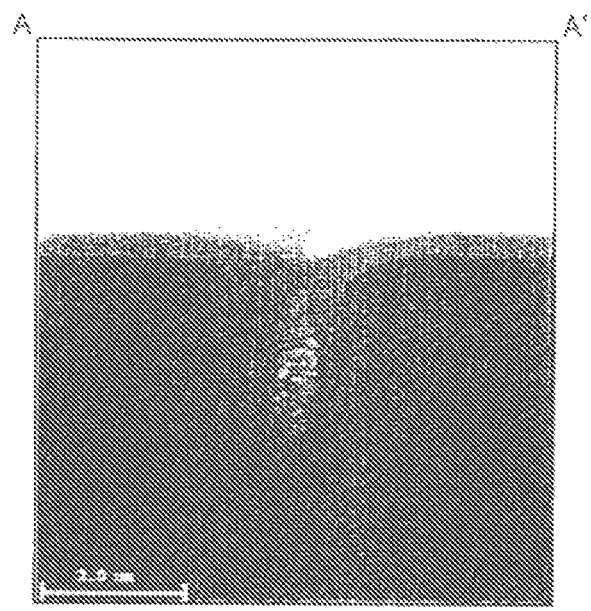
FIG. 38 is an electron micrograph observing the cross section along the line segment A-A' of FIG. 37.
Figure 39:
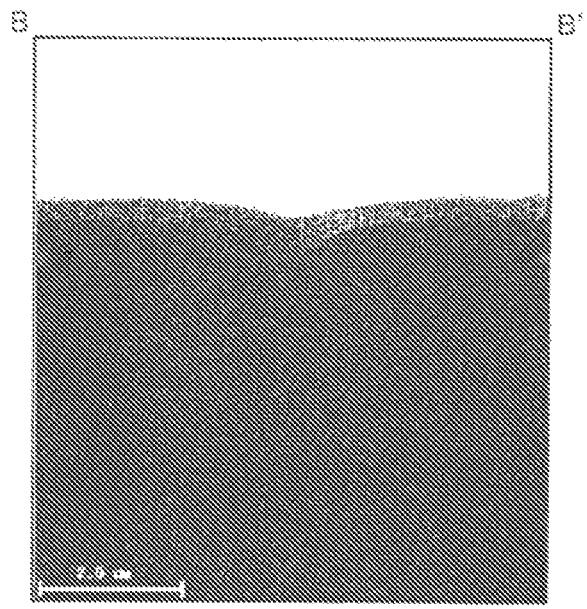
FIG. 39 is an electron micrograph observing the cross section along the line segment B-B' of FIG. 37.
Figure 40:
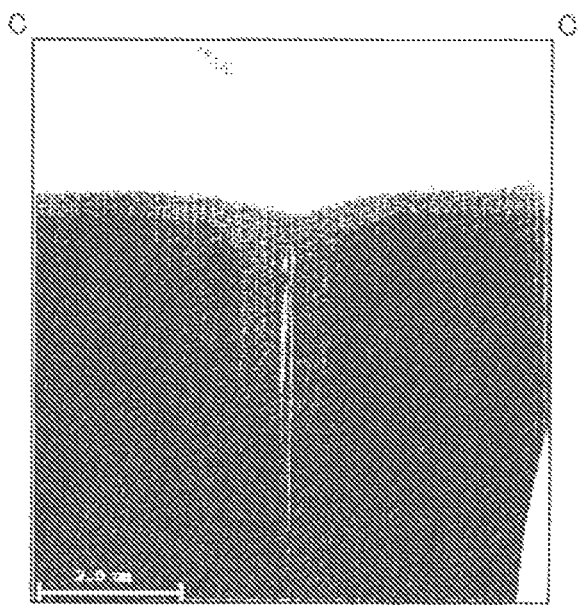
FIG. 40 is an electron micrograph observing the cross section along the line segment C-C' of FIG. 37.
Figure 41:
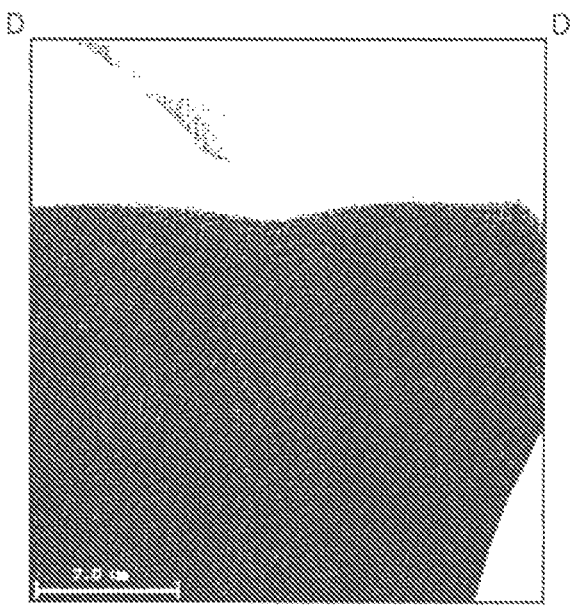
FIG. 41 is an electron micrograph observing the cross section along the line segment D-D' of FIG. 37.
Figure 42:
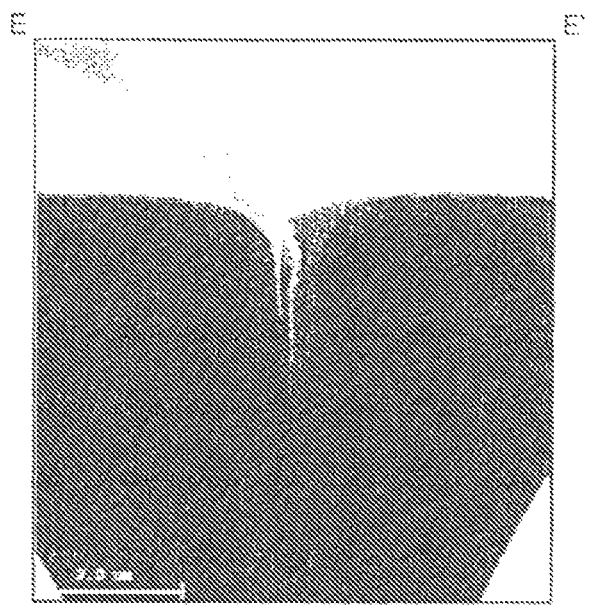
FIG. 42 is an electron micrograph observing the cross section along the line segment E-E' of FIG. 37.
Figure 43:
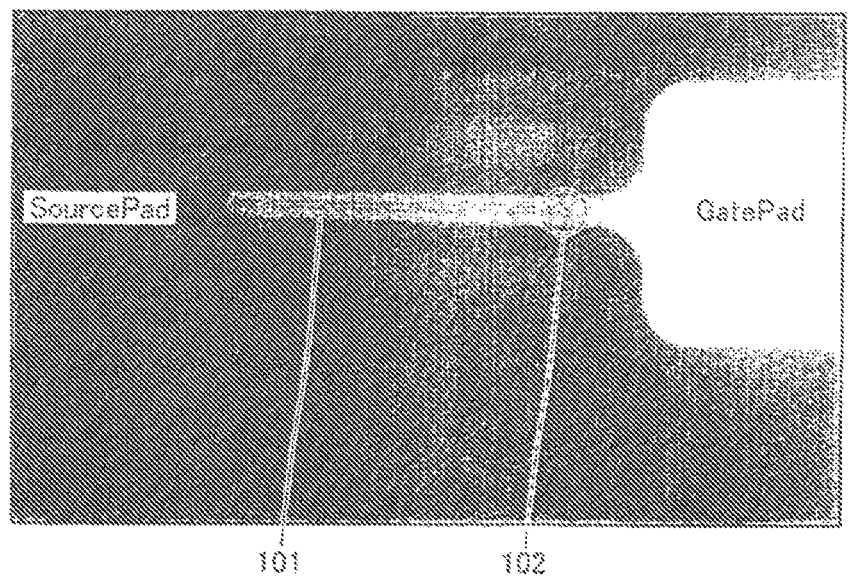
FIG. 43 is an electron micrograph that shows the result of a leak analysis conducted on a MOSFET having a conventional trench structure.

Now a semiconductor device including an n$^+$-type source region and such a region on a silicon carbide semiconductor device including trenches shaped according to the invention will be described below. FIG. 33 is an electron micrograph schematically showing a silicon carbide semiconductor device according to the invention. FIG. 34 is a cross sectional view along the line segment X-X' of FIG. 33. FIG. 35 is a cross sectional view along the line segment Y-Y' of FIG. 33.

Herein, the description is made in connection with the SiC semiconductor device according the second embodiment. As shown in FIG. 33, p$^+$-type base region 32 is formed on an SiC semiconductor substrate and n$^+$-type source region 33 is formed in the surface portion of p$^+$-type base region 32. The region of p$^+$-type base region 32, in which n$^+$-type source region 33 is formed, works for an active region. The region, outside the active region, of p$^+$-type base region 32, in which n$^+$-type source region 33 is not formed, works for an edge region. Straight trench section 2 is disposed in the active region. The side walls of the trenches constituting straight trench section 2 coincide with the (1-100) plane and the (−1100) plane of 4H—SiC. Connecting trench section 5 is disposed in the edge region. Straight trench section 2 and connecting trench section 5 are connected to each other to form trench 1. The shape of trench 1 is the same, for example, as that according to the second embodiment. The p$^+$-type base region 32 disposed in a channel region is positioned inside trench 1.

In the cross sectional view shown in FIG. 34 along the line segment X-X' of FIG. 33, p$^+$-type base region 32 is disposed on the SiC substrate working for n$^-$-type drift region 31. Connecting trench section 5 is formed through p$^+$-type base region 32 down to n$^-$-type drift region 31. The straight trench section not illustrated in FIG. 34 is formed down to n$^-$-type drift region 31. In a part of the surface portion of p$^+$-type base region 32 in the channel region, n$^+$-type source region 33 is disposed.

In the cross sectional view shown in FIG. 35 along the line segment Y-Y' of FIG. 33, n$^+$-type source region 33 is disposed in the surface portion of p$^+$-type base region 32 in the channel region. The other structure is the same as that in the cross section along the line segment X-X' of FIG. 33. A not-shown gate insulator film is formed in trench 1. A gate electrode is formed on the gate insulator film. Thus, a vertical MOSFET is completed.

The trench side walls are made to coincide with the (1-100) plane and the (−1100) plane of 4H—SiC according to the invention. Alternatively, the trench side walls may be made to coincide with the other crystal planes that are hardly deformed by a heat treatment. For example, the (11-20) plane and the (−1-120) plane of 4H—SiC may be employed with no problem. The semiconductor device obtained by using the silicon carbide semiconductor device having the trench shape according to the invention is exemplary. Therefore, changes and modifications will be obvious to the persons skilled in the art without departing from the true spirit of the invention for meeting the use of the semiconductor device.

When the cell pitch in straight trench section 2 is 48 μm or longer, connecting trench section 5 may be shaped with a circle as shown in FIG. 32. It is found from the results shown in FIG. 32 that connecting trench section 5 is shaped almost with a circle after the heat treatment thereof.

As described above, the silicon carbide semiconductor device and the manufacturing method thereof according to the invention are useful for power semiconductor devices having a trench structure and for the manufacture thereof.

Thus, a silicon carbide semiconductor device and the manufacturing method thereof have been described according to the present invention. Many modifications and variations may be made to the techniques and structures described and illustrated herein without departing from the spirit and scope of the invention. Accordingly, it should be understood that the devices and methods described herein are illustrative only and are not limiting upon the scope of the invention.

What is claimed is:

1. A silicon carbide semiconductor device comprising:
   a silicon carbide semiconductor substrate of a first conductivity type;
   a trench, in a surface portion of the semiconductor substrate, end portions of the trenches being connected to each other such that a polygon is formed;
   a base region of a second conductivity type disposed in adjacent to the trench;
   a source region of the first conductivity type disposed in the base region; and
   a gate electrode in the trench with a gate insulator film interposed therebetween.

2. The silicon carbide semiconductor device according to claim 1, wherein each interior angle of the polygon formed by the trench is 150 degrees.

3. The silicon carbide semiconductor device according to claim 1, wherein each interior angle of the polygon formed by the trench is 160 degrees.

4. The silicon carbide semiconductor device according to claim 1, wherein each interior angle of the polygon formed by the trench is 168.75 degrees.

5. A silicon carbide semiconductor device comprising:
   a trench, in a surface portion of a silicon carbide semiconductor substrate, end portions of the trenches being connected to each other;
   a base region disposed in adjacent to the trench and having a conductivity different from the substrate;
   a source region disposed in the base region and having a conductivity different from the base region; and
   a gate electrode disposed in the trench with a gate insulator film interposed therebetween,
   wherein the outer sidewalls of the end portions of the trenches form a straight and the inner sidewalls of the end portions of the trenches form a polygon.

* * * * *